United States Patent
Watanabe

(10) Patent No.: US 11,035,914 B2
(45) Date of Patent: Jun. 15, 2021

(54) MAGNETIC SENSOR

(71) Applicant: TDK CORPORATION, Tokyo (JP)

(72) Inventor: Kazuya Watanabe, Tokyo (JP)

(73) Assignee: TDK CORPORATION, Tokyo (JP)

(*) Notice: Subject to any disclaimer, the term of this patent is extended or adjusted under 35 U.S.C. 154(b) by 141 days.

(21) Appl. No.: 16/208,995

(22) Filed: Dec. 4, 2018

(65) Prior Publication Data

US 2019/0195969 A1 Jun. 27, 2019

(30) Foreign Application Priority Data

Dec. 26, 2017 (JP) .............................. JP2017-249601
Oct. 9, 2018 (JP) .............................. JP2018-190584

(51) Int. Cl.
*G01R 33/02* (2006.01)
*G01R 33/09* (2006.01)
*H01L 43/08* (2006.01)

(52) U.S. Cl.
CPC ....... *G01R 33/098* (2013.01); *G01R 33/0206* (2013.01); *G01R 33/093* (2013.01); *H01L 43/08* (2013.01)

(58) Field of Classification Search
CPC .... G01R 33/02; G01R 33/09; G01R 33/0206; G01R 33/091; G01R 33/093; G01R 33/098; H01L 43/08
USPC ........ 324/247, 207.21, 207.2, 251, 252, 260
See application file for complete search history.

(56) References Cited

U.S. PATENT DOCUMENTS

| 6,255,813 | B1 * | 7/2001 | Isomura | B82Y 25/00 324/244 |
| 9,530,957 | B2 | 12/2016 | Sugihara et al. | |
| 2012/0013332 | A1 * | 1/2012 | Honkura | G01R 33/063 324/244 |
| 2014/0266184 | A1 * | 9/2014 | Jeng | G01R 33/0005 324/252 |

FOREIGN PATENT DOCUMENTS

| JP | 2016-118409 A | 6/2016 | |
| WO | WO-2017094888 A1 * | 6/2017 | ............. H01L 43/12 |

* cited by examiner

*Primary Examiner* — Melissa J Koval
*Assistant Examiner* — Courtney G McDonnough
(74) *Attorney, Agent, or Firm* — Oliff PLC

(57) ABSTRACT

A magnetic sensor includes first to third detection units for detecting components in X, Y, and Z directions of an external magnetic field. A reference plane orthogonal to the Z direction includes first to third regions formed by vertically projecting the first to third detection units thereonto. The first region includes two partial regions located on opposite sides of the third region in a direction parallel to a first straight line, and the second region includes two partial regions located on opposite sides of the third region in a direction parallel to a second straight line, the first and second straight lines being two mutually orthogonal straight lines that pass through the centroid of the third region and are perpendicular to the Z direction.

15 Claims, 15 Drawing Sheets

MAGNETIC SENSOR

BACKGROUND OF THE INVENTION

1. Field of the Invention

The present invention relates to a magnetic sensor for detecting components of an external magnetic field that are in three mutually orthogonal directions.

2. Description of the Related Art

Recent mobile communication devices such as mobile phones may incorporate geomagnetic sensors. The geomagnetic sensors for use in such devices are required to be small in size and capable of detecting three-dimensional directions of an external magnetic field. Such geomagnetic sensors are realized by using magnetic sensors configured to detect components of an external magnetic field that are in three mutually orthogonal directions. Some known magnetic sensors use a plurality of magnetic detection elements provided on a substrate. Examples of the magnetic detection elements include magnetoresistive elements.

U.S. Pat. No. 9,530,957 B2 discloses a geomagnetic sensor in which an X-axis magnetic sensor, a Y-axis magnetic sensor, and a Z-axis magnetic sensor are provided on a base. In this geomagnetic sensor, the Z-axis magnetic sensor includes magnetoresistive elements and soft magnetic bodies. The soft magnetic bodies convert vertical magnetic field components, which are in a direction parallel to the Z-axis, into horizontal magnetic field components in a direction perpendicular to the Z-axis, and supply the horizontal magnetic field components to the magnetoresistive elements.

JP2016-118409A discloses a magnetic sensor mounted on a sensor board. This magnetic sensor is constituted of an X-axis sensor, a Y-axis sensor, and a Z-axis sensor. The Z-axis sensor has a magnetoresistive element, and an Z-magnetic field conversion element formed of a magnetic material. The Z-magnetic field conversion element convers a magnetic field in a Z direction into a magnetic field along an X-Y plane.

Magnetic sensors incorporating three integrated detection units for detecting components in three mutually orthogonal directions of an external magnetic field have a problem that two of the detection units may differ in characteristic from each other or suffer characteristic degradation because of the layout of the three detection units.

For example, in the geomagnetic sensor disclosed in U.S. Pat. No. 9,530,957 B2, the X-axis magnetic sensor and the Y-axis magnetic sensor as integrated may fail to provide outputs of equivalent characteristics even if they are designed to have equivalent characteristics by themselves. The reason therefor is considered to be that the soft magnetic body included in the Z-axis magnetic sensor acts to concentrate a magnetic flux, and due to such an action, the magnetic fields to be applied to the X- and Y-axis magnetic sensors become different from those in the case where there is no soft magnetic body.

In the magnetic sensor disclosed in JP2016-118409A, the characteristics of the X-axis sensor when subjected to an external magnetic field in an X direction and the characteristics of the Y-axis sensor when subjected to an external magnetic field in a Y direction can be degraded relative to their respective characteristics as designed. Such degradation is considered to occur due to the layout of the X-, Y-, and Z-axis sensors.

SUMMARY OF THE INVENTION

It is an object of the present invention to provide a magnetic sensor including three integrated detection units for detecting components of an external magnetic field that are in three mutually orthogonal directions, the magnetic sensor being capable of preventing any difference between the characteristics of two of the detection units and any degradation of the characteristics of the two of the detection units from occurring due to the layout of the three detection units.

A magnetic sensor of the present invention includes: a first detection unit for detecting a first component of an external magnetic field, the first component being in a direction parallel to a first direction; a second detection unit for detecting a second component of the external magnetic field, the second component being in a direction parallel to a second direction; a third detection unit for detecting a third component of the external magnetic field, the third component being in a direction parallel to a third direction; and a support for supporting the first to third detection units.

The first to third directions are orthogonal to each other. Each of the first to third detection units includes at least one magnetic detection element. The third detection unit further includes a soft magnetic structure formed of a soft magnetic material.

The support has a reference plane orthogonal to the third direction. The reference plane includes a first region, a second region, and a third region different from each other. The first region is a region formed by vertically projecting the first detection unit onto the reference plane. The second region is a region formed by vertically projecting the second detection unit onto the reference plane. The third region is a region formed by vertically projecting the third detection unit onto the reference plane.

The first region includes a first partial region and a second partial region located on opposite sides of the third region in a direction parallel to a first straight line, and the second region includes a third partial region and a fourth partial region located on opposite sides of the third region in a direction parallel to a second straight line, the first straight line and the second straight line being two mutually orthogonal straight lines that pass through the centroid of the third region and are perpendicular to the third direction.

In the magnetic sensor of the present invention, no portion of the first region may be intersected by the second straight line, and no portion of the second region may be intersected by the first straight line.

In the magnetic sensor of the present invention, the support may include a substrate having a top surface. In such a case, the first to third detection units may be disposed on or above the top surface of the substrate. The reference plane may be the top surface of the substrate.

In the magnetic sensor of the present invention, all the magnetic detection elements included in the first to third detection units may be located at equal distances from the reference plane.

In the magnetic sensor of the present invention, the soft magnetic structure may include a magnetic-field conversion section configured to receive the third component of the external magnetic field and output an output magnetic field component, the output magnetic field component being in a direction perpendicular to the third direction. The output magnetic field component has a strength having a correspondence with the strength of the third component of the external magnetic field. In such a case, the third detection unit may detect the strength of the output magnetic field component.

In the magnetic sensor of the present invention, the soft magnetic structure may include at least one soft magnetic layer.

In the magnetic sensor of the present invention, when viewed in the third direction, the first region and the second region may have such a positional relationship that the first region coincides with the second region if the first region is rotated 90° about the centroid of the third region.

In the magnetic sensor of the present invention, each of the first and second partial regions may have a symmetrical shape with respect to the first straight line, and each of the third and fourth partial regions may have a symmetrical shape with respect to the second straight line.

In the magnetic sensor of the present invention, the at least one magnetic detection element may be at least one magnetoresistive element.

In the magnetic sensor of the present invention, the first straight line may be parallel to the first direction or parallel to the second direction. Alternatively, the first straight line may form an angle of 45° with the first direction.

In the magnetic sensor of the present invention, the first region includes the first partial region and the second partial region located on opposite sides of the third region in a direction parallel to the first straight line, and the second region includes the third partial region and the fourth partial region located on opposite sides of the third region in a direction parallel to the second straight line. According to the present invention, such a configuration makes it possible to prevent any difference between the characteristics of two of the detection units and any degradation of the characteristics of the two of the detection units from occurring due to the layout of the three detection units.

Other and further objects, features and advantages of the present invention will appear more fully from the following description.

DETAILED DESCRIPTION OF THE PREFERRED EMBODIMENTS

First Embodiment

Preferred embodiments of the present invention will now be described in detail with reference to the drawings. First, reference is made to FIG. 1 to describe a schematic configuration of a magnetic sensor according to a first embodiment of the invention. The magnetic sensor 1 according to the first embodiment is a sensor for detecting components of an external magnetic field that are in three mutually orthogonal directions.

Figure 1:
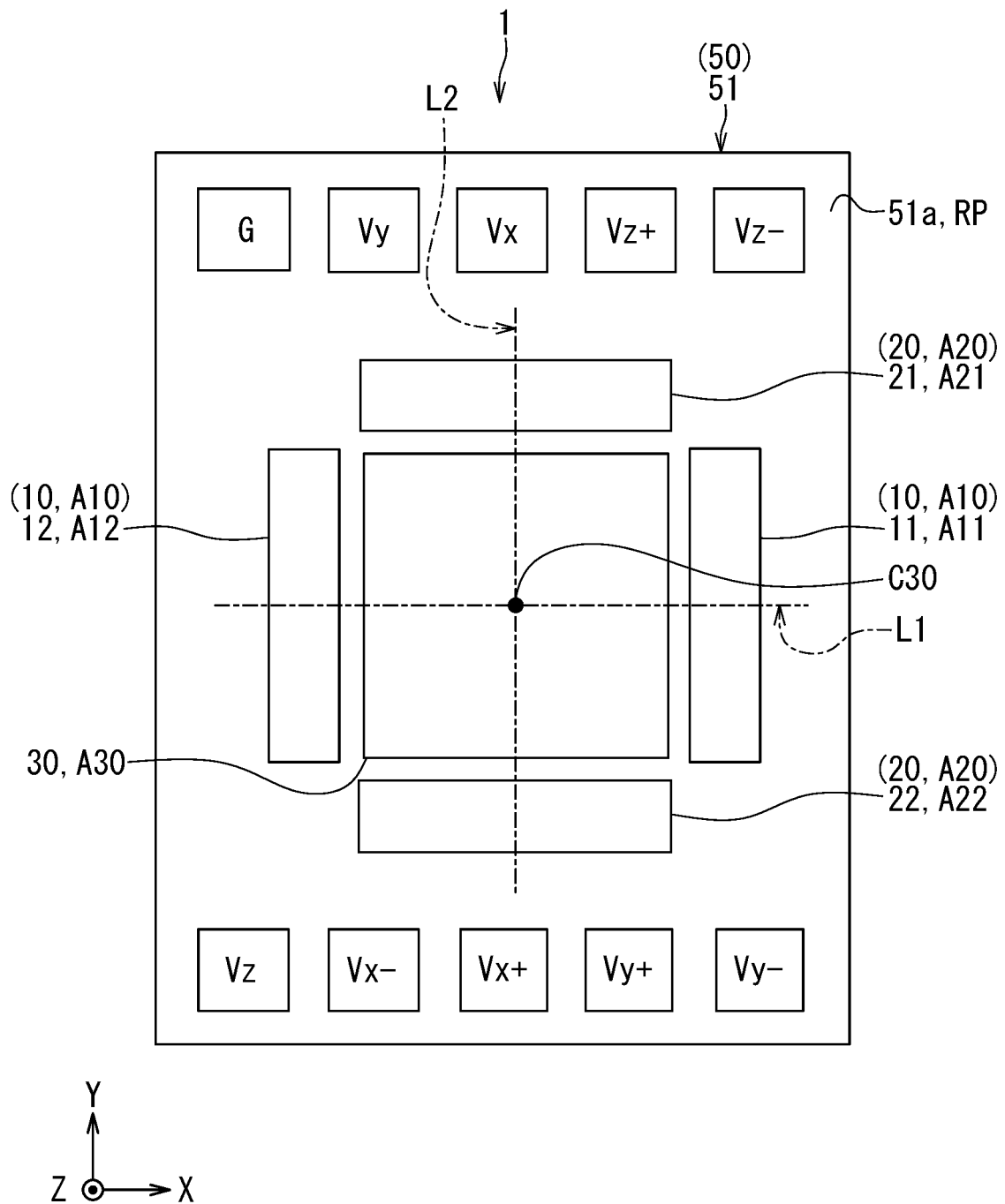
FIG. 1 is a plan view illustrating a schematic configuration of a magnetic sensor according to a first embodiment of the invention.

As shown in FIG. 1, the magnetic sensor 1 includes a first detection unit 10, a second detection unit 20, a third detection unit 30, and a support 50. The first detection unit 10 detects a first component of an external magnetic field, the first component being in a direction parallel to a first direction. The second detection unit 20 detects a second component of the external magnetic field, the second component being in a direction parallel to a second direction.

The third detection unit 30 detects a third component of the external magnetic field, the third component being in a direction parallel to a third direction. The first to third directions are orthogonal to each other. Each of the first to third detection units 10, 20 and 30 includes at least one magnetic detection element.

The third detection unit 30 further includes a soft magnetic structure 40 formed of a soft magnetic material. The soft magnetic structure 40 includes a magnetic-field conversion section 42 and at least one soft magnetic layer. The magnetic-field conversion section 42 is configured to receive the third component of the external magnetic field and output an output magnetic field component, the output magnetic field component being in a direction perpendicular to the third direction. Hereinafter, the third component of the external magnetic field will also be referred to as the input magnetic field component. The output magnetic field component has a strength having a correspondence with the strength of the input magnetic field component. The third detection unit 30 detects the strength of the input magnetic field component by detecting the strength of the output magnetic field component. The soft magnetic structure 40 will be described in detail later.

The support 50 is a structure for supporting the first to third detection units 10, 20 and 30. The support 50 includes a substrate 51. The substrate 51 has a top surface 51a and a bottom surface opposite to each other.

Now, we define X, Y and Z directions as shown in FIG. 1. The X, Y and Z directions are orthogonal to each other. The X and Y directions are parallel to the top surface 51a of the substrate 51. The Z direction is perpendicular to the top surface 51a of the substrate 51 and from the bottom surface of the substrate 51 to the top surface 51a of the substrate 51. The opposite directions to the X, Y, and Z directions will be referred to as −X, −Y, and −Z directions, respectively. As used herein, the term "above" refers to positions located forward of a reference position in the Z direction, and "below" refers to positions located on a side of the reference position opposite to "above". For each component of the magnetic sensor 1, the term "top surface" as used herein refers to a surface of the component lying at the end thereof in the Z direction, and "bottom surface" refers to a surface of the component lying at the end thereof in the −Z direction.

In the present embodiment, specifically, the first direction is the same as the X direction, the second direction is the same as the Y direction, and the third direction is the same as the Z direction.

The first to third detection units 10, 20 and 30 are disposed on or above the top surface 51a of the substrate 51.

The support 50 has a reference plane RP orthogonal to the third direction, i.e., the Z direction. In the present embodiment, the reference plane RP is specifically the top surface 51a of the substrate 51.

The reference plane RP includes three different regions: a first region A10; a second region A20; and a third region A30. The first region A10 is a region formed by vertically projecting the first detection unit 10 onto the reference plane RP. The second region A20 is a region formed by vertically projecting the second detection unit 20 onto the reference plane RP. The third region A30 is a region formed by vertically projecting the third detection unit 30 onto the reference plane RP.

Here, two mutually orthogonal straight lines that are perpendicular to the third direction (the Z direction) and pass through the centroid C30 of the third region A30 will be referred to as a first straight line L1 and a second straight line L2. In the present embodiment, specifically, the first straight line L1 is parallel to the X direction, and the second straight line L2 is parallel to the Y direction.

In the present embodiment, the first detection unit 10 includes a first portion 11 and a second portion 12 located at different positions from each other. The first region A10 includes a first partial region A11 formed by vertically projecting the first portion 11 onto the reference plane RP, and a second partial region A12 formed by vertically projecting the second portion 12 onto the reference plane RP. The first and second partial regions A11 and A12 are located on opposite sides of the third region A30 in a direction parallel to the first straight line L1.

The second detection unit 20 includes a first portion 21 and a second portion 22 located at different positions from each other. The second region A20 includes a third partial region A21 formed by vertically projecting the first portion 21 onto the reference plane RP, and a fourth partial region A22 formed by vertically projecting the second portion 22 onto the reference plane RP. The third and fourth partial regions A21 and A22 are located on opposite sides of the third region A30 in a direction parallel to the second straight line L2.

In the present embodiment, both the first and second partial regions A11 and A12 are located to be intersected by the first straight line L1. On the other hand, both the third and fourth partial regions A21 and A22 are located to be intersected by the second straight line L2.

It is preferred that no portion of the first region A10 be intersected by the second straight line L2. It is also preferred that no portion of the second region A20 be intersected by the first straight line L1.

In the present embodiment, in particular, when viewed in the third direction (the Z direction), the first region A10 and the second region A20 have such a positional relationship that the first region A10 coincides with the second region A20 if the first region A10 is rotated 90° about the centroid C30 of the third region A30. In FIG. 1, the first and second partial regions A11 and A12 respectively coincide with the third and fourth partial regions A21 and A22 if the first and second partial regions A11 and A12 are rotated 90° counterclockwise about the centroid C30.

In the present embodiment, specifically, each of the first and second partial regions A11 and A12 has a symmetrical shape with respect to the first straight line L1. Each of the third and fourth partial regions A21 and A22 has a symmetrical shape with respect to the second straight line L2.

As shown in FIG. 1, the magnetic sensor 1 further includes a plurality of terminals disposed on or above the top surface 51a of the substrate 51. The plurality of terminals include: a power supply terminal Vx and output terminals Vx+ and Vx− corresponding to the first detection unit 10; a power supply terminal Vy and output terminals Vy+ and Vy− corresponding to the second detection unit 20; a power supply terminal Vz and output terminals Vz+ and Vz− corresponding to the third detection unit 30; and a ground terminal G shared between the first to third detection units 10, 20 and 30.

Figure 2:
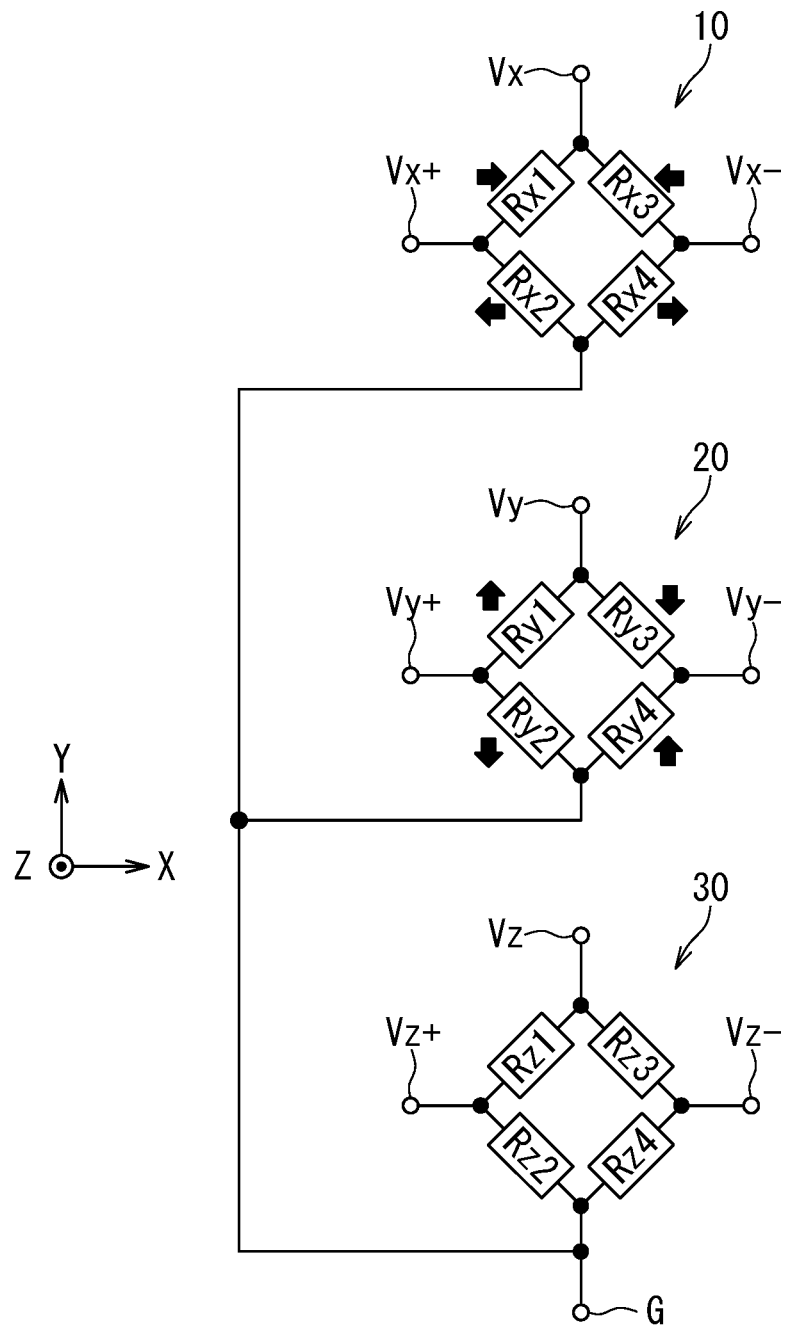
FIG. 2 is a circuit diagram illustrating an example circuit configuration of the magnetic sensor according to the first embodiment of the invention.

Reference is now made to FIG. 2 to describe an example circuit configuration of the magnetic sensor 1. In this example, the first detection unit 10 includes four resistor sections Rx1, Rx2, Rx3, and Rx4 constituting a Wheatstone bridge circuit. Each of the resistor sections Rx1, Rx2, Rx3, and Rx4 has a resistance value that varies depending on the first component, i.e., the component in a direction parallel to the first direction (the X direction), of the external magnetic field. The resistor section Rx1 is provided between the power supply terminal Vx and the output terminal Vx+. The resistor section Rx2 is provided between the output terminal Vx+ and the ground terminal G The resistor section Rx3 is provided between the power supply terminal Vx and the output terminal Vx−. The resistor section Rx4 is provided between the output terminal Vx− and the ground terminal G.

The second detection unit 20 includes four resistor sections Ry1, Ry2, Ry3, and Ry4 constituting a Wheatstone bridge circuit. Each of the resistor sections Ry1, Ry2, Ry3, and Ry4 has a resistance value that varies depending on the second component, i.e., the component in a direction parallel to the second direction (the Y direction), of the external magnetic field. The resistor section Ry1 is provided between the power supply terminal Vy and the output terminal Vy+. The resistor section Ry2 is provided between the output terminal Vy+ and the ground terminal G The resistor section Ry3 is provided between the power supply terminal Vy and the output terminal Vy−. The resistor section Ry4 is provided between the output terminal Vy− and the ground terminal G.

The third detection unit 30 includes four resistor sections Rz1, Rz2, Rz3, and Rz4 constituting a Wheatstone bridge circuit. Each of the resistor sections Rz1, Rz2, Rz3, and Rz4 has a resistance value that varies depending on the output magnetic field component outputted from the magnetic-field conversion section 42. The resistor section Rz1 is provided between the power supply terminal Vz and the output terminal Vz+. The resistor section Rz2 is provided between the output terminal Vz+ and the ground terminal G The resistor section Rz3 is provided between the power supply terminal Vz and the output terminal Vz−. The resistor section Rz4 is provided between the output terminal Vz− and the ground terminal G.

Hereinafter, the term "resistor section R" is used to refer to any one of the resistor sections Rx1, Rx2, Rx3, Rx4, Ry1, Ry2, Ry3, Ry4, Rz1, Rz2, Rz3, and Rx4. Each resistor section R includes at least one magnetic detection element. In the present embodiment, the at least one magnetic detection element is specifically at least one magnetoresistive element. The magnetoresistive element will hereinafter be referred to as MR element.

In the present embodiment, the MR element is specifically a spin-valve MR element. The spin-valve MR element includes a magnetization pinned layer having a magnetization in a fixed direction, a free layer having a magnetization whose direction is variable depending on the direction of an applied magnetic field, and a gap layer located between the magnetization pinned layer and the free layer. Each of the free layer and the magnetization pinned layer contains a magnetic material. The spin-valve MR element may be a tunneling magnetoresistive (TMR) element or a giant magnetoresistive (GMR) element. In the TMR element, the gap layer is a tunnel barrier layer. In the GMR element, the gap layer is a nonmagnetic conductive layer. The spin-valve MR element varies in resistance value depending on the angle that the magnetization direction of the free layer forms with the magnetization direction of the magnetization pinned layer. The resistance value of the spin-valve MR element is minimized when the foregoing angle is 0°, and maximized when the foregoing angle is 180°. In each MR element, the free layer has a shape anisotropy that sets the direction of the magnetization easy axis to be orthogonal to the magnetization direction of the magnetization pinned layer.

In FIG. 2, the filled arrows indicate the magnetization directions of the magnetization pinned layers of the MR elements. In the example shown in FIG. 2, the magnetization pinned layers of the MR elements in the resistor sections Rx1 and Rx4 have magnetizations in the X direction, and the magnetization pinned layers of the MR elements in the resistor sections Rx2 and Rx3 have magnetizations in the −X direction.

The magnetization pinned layers of the MR elements in the resistor sections Ry1 and Ry4 have magnetizations in the Y direction, and the magnetization pinned layers of the MR elements in the resistor sections Ry2 and Ry3 have magnetizations in the −Y direction. A description will be given later as to the magnetization directions of the magnetization pinned layers of the MR elements in the resistor sections Rz1, Rz2, Rz3 and Rz4.

The detection value for the first component of the external magnetic field has a correspondence with a potential difference between the output terminal Vx+ and the output terminal Vx−. The detection value for the second component of the external magnetic field has a correspondence with a potential difference between the output terminal Vy+ and the output terminal Vy−. The detection value for the third component of the external magnetic field, i.e., the input magnetic field component, has a correspondence with a potential difference between the output terminal Vz+ and the output terminal Vz−. For example, each detection value may be an amplitude-adjusted or offset-adjusted value of the corresponding potential difference.

Figure 3:
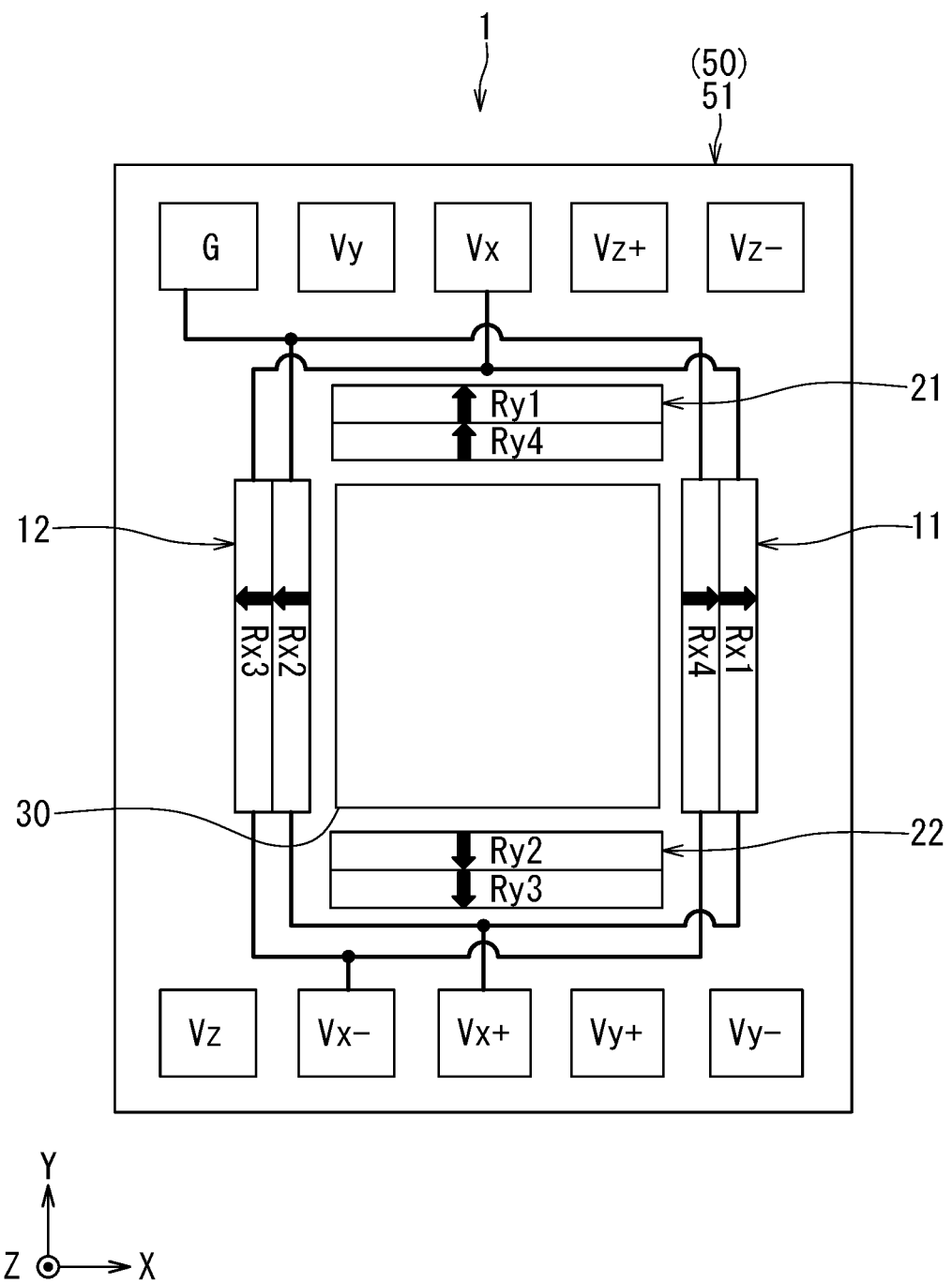
FIG. 3 is an explanatory diagram illustrating the configuration of first and second detection units and wiring for the first detection unit of the magnetic sensor according to the first embodiment of the invention.
Figure 4:
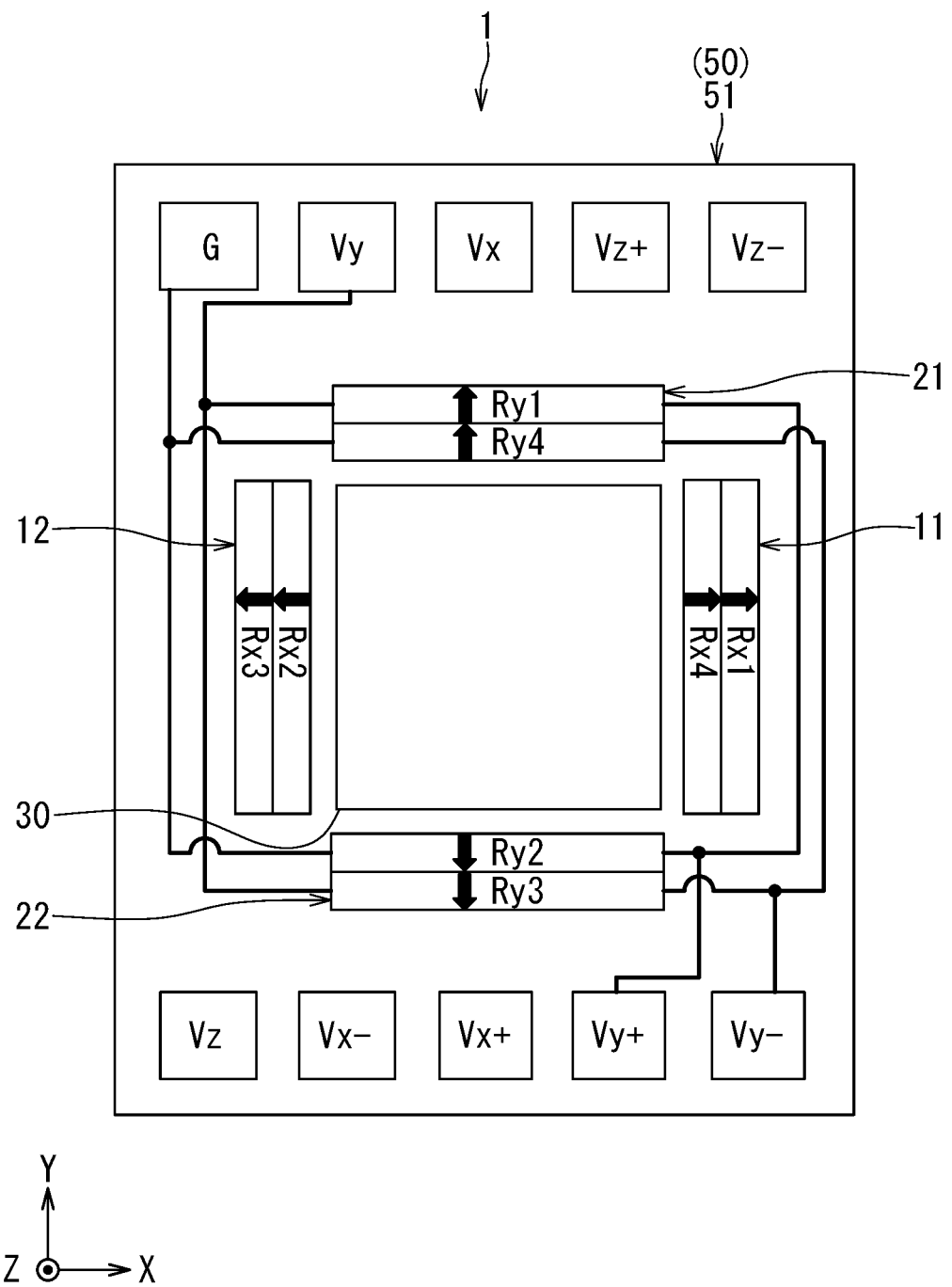
FIG. 4 is an explanatory diagram illustrating the configuration of the first and second detection units and wiring for the second detection unit of the magnetic sensor according to the first embodiment of the invention.

Now, an example of arrangement of the resistor sections Rx1, Rx2, Rx3, Rx4, Ry1, Ry2, Ry3, and Ry4 will be described with reference to FIGS. 3 and 4. In this example, the first portion 11 of the first detection unit 10 includes the resistor sections Rx1 and Rx4, and the second portion 12 of the first detection unit 10 includes the resistor sections Rx2 and Rx3. The first portion 21 of the second detection unit 20 includes the resistor sections Ry1 and Ry4, and the second portion 22 of the second detection unit 20 includes the resistor sections Ry2 and Ry3. FIG. 3 also illustrates wiring for the first detection unit 10. FIG. 4 also illustrates wiring for the second detection unit 20.

In FIGS. 3 and 4, the filled arrows indicate the magnetization directions of the magnetization pinned layers of the MR elements. In the example shown in FIGS. 3 and 4, the magnetization pinned layers of the MR elements included in each of the first portion 11 of the first detection unit 10, the second portion 12 of the first detection unit 10, the first portion 21 of the second detection unit 20, and the second portion 22 of the second detection unit 20 have the same magnetization direction. According to this example, it is thus easy to set the magnetization directions of the magnetization pinned layers in a plurality of MR elements.

Figure 5:
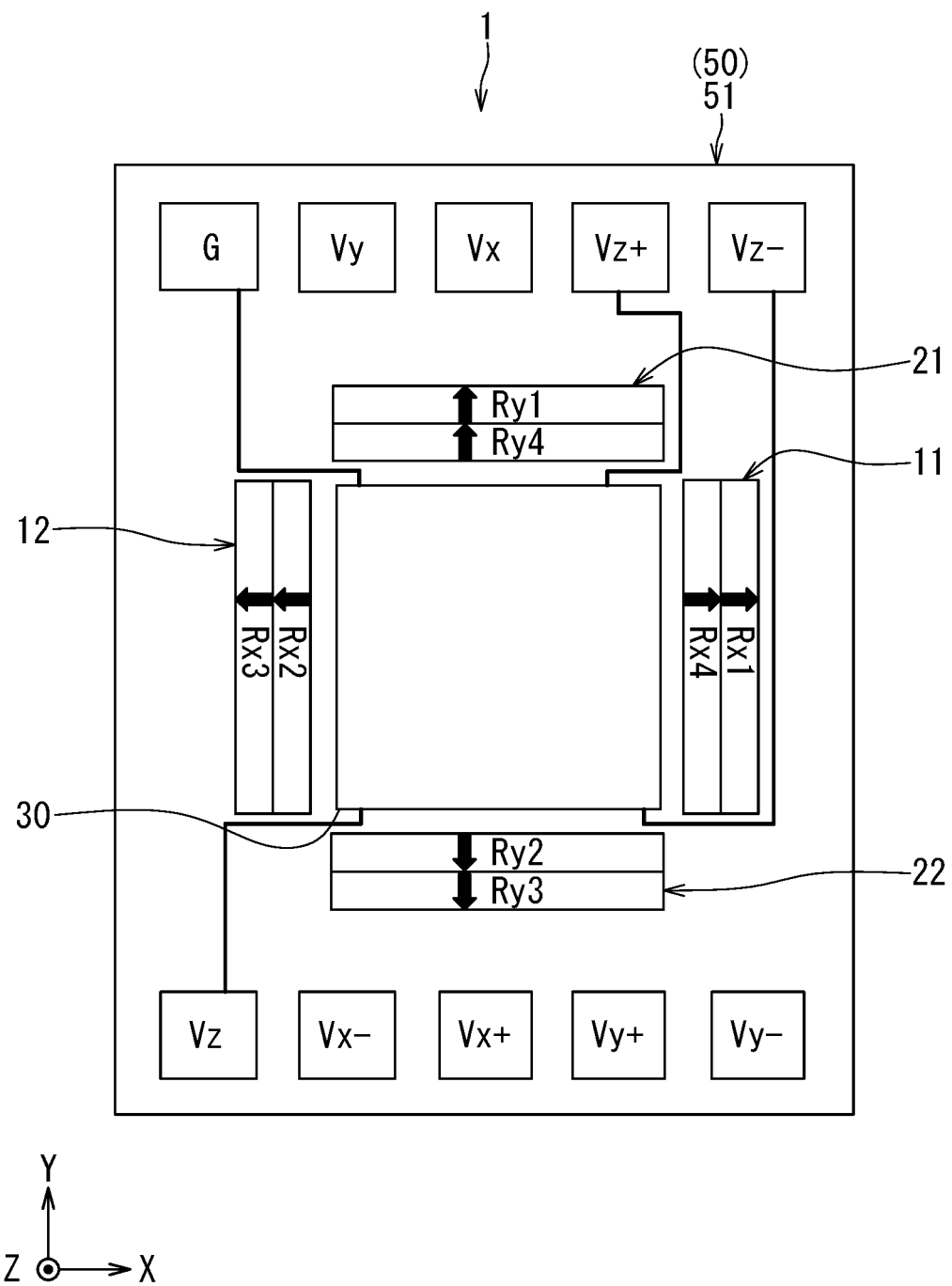
FIG. 5 is an explanatory diagram illustrating wiring for a third detection unit of the magnetic sensor according to the first embodiment of the invention.

FIG. 5 illustrates wiring for the third detection unit 30.

An example configuration of the MR element will now be described with reference to FIG. 6. The MR element 100 shown in FIG. 6 includes an antiferromagnetic layer 101, a magnetization pinned layer 102, a gap layer 103, and a free layer 104 which are stacked in this order, the antiferromagnetic layer 101 being closest to the substrate 51. The antiferromagnetic layer 101 is formed of an antiferromagnetic material and is in exchange coupling with the magnetization pinned layer 102 so as to fix the magnetization direction of the magnetization pinned layer 102.

Figure 6:
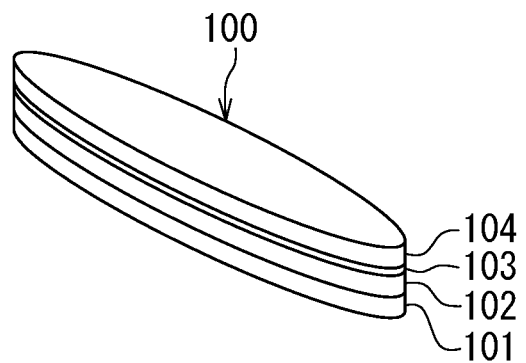
FIG. 6 is a perspective view of a magnetoresistive element of the magnetic sensor according to the first embodiment of the invention.

It should be noted that the layers 101 to 104 of the MR element 100 may be stacked in the reverse order to that shown in FIG. 6. Alternatively, the MR element 100 may be configured without the antiferromagnetic layer 101. In such a case, for example, the antiferromagnetic layer 101 and the magnetization pinned layer 102 may be replaced with a magnetization pinned layer of an artificial antiferromagnetic structure, which includes two ferromagnetic layers and a nonmagnetic metal layer between the two ferromagnetic layers. The magnetic detection elements may be elements that are other than MR elements and configured to detect a magnetic field, such as Hall elements, magnetic impedance elements and so on.

Figure 7:
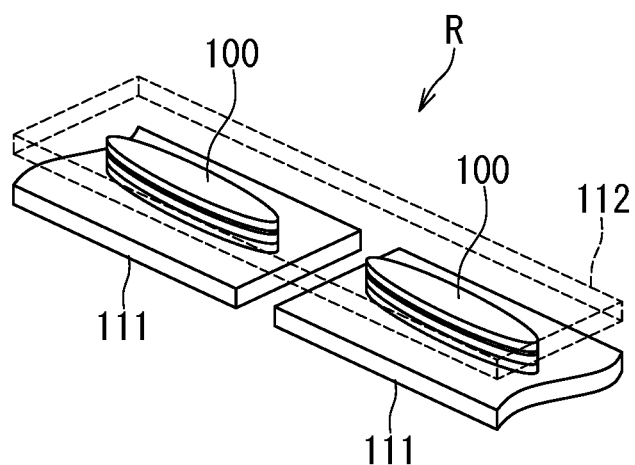
FIG. 7 is a perspective view of part of a resistor section of the magnetic sensor according to the first embodiment of the invention.

An example configuration of the resistor section R will now be described with reference to FIG. 7. In this example, the resistor section R includes a plurality of MR elements 100 connected in series. The resistor section R further includes one or more connection layers each of which electrically connects two MR elements 100 that are adjacent to each other in circuit configuration, so that the plurality of MR elements 100 are connected in series. In the example shown in FIG. 7, the resistor section R includes one or more upper connection layers 112 and one or more lower connection layers 111, as the one or more connection layers. Each lower connection layer 111 is in contact with the bottom surfaces of two MR elements 100 that are adjacent to each other in circuit configuration, and electrically connects the two MR elements 100. Each upper connection layer 112 is in contact with the top surfaces of two MR elements 100 that are adjacent to each other in circuit configuration, and electrically connects the two MR elements 100.

Next, an example configuration of the magnetic-field conversion section 42 of the third detection unit 30 will be described with reference to FIG. 8. In this example, the magnetic-field conversion section 42 includes: an upper yoke 42T1 and a lower yoke 42B1 corresponding to the resistor section Rz1; an upper yoke 42T2 and a lower yoke 42B2 corresponding to the resistor section Rz2; an upper yoke 42T3 and a lower yoke 42B3 corresponding to the resistor section Rz3; and an upper yoke 42T4 and a lower yoke 42B4 corresponding to the resistor section Rz4.

The upper yokes 42T1, 42T2, 42T3 and 42T4 and the lower yokes 42B1, 42B2, 42B3 and 42B4 are each in the shape of a rectangular solid that is long in a direction perpendicular to the Z direction.

The upper yoke 42T1 and the lower yoke 42B1 are located near the resistor section Rz1. The lower yoke 42B1 is located closer to the top surface 51a of the substrate 51 than the resistor section Rz1. The upper yoke 42T1 is located farther from the top surface 51a of the substrate 51 than the resistor section Rz1. When viewed from above, the resistor section Rz1 lies between the upper yoke 42T1 and the lower yoke 42B1.

The upper yoke 42T2 and the lower yoke 42B2 are located near the resistor section Rz2. The lower yoke 42B2 is located closer to the top surface 51a of the substrate 51 than the resistor section Rz2. The upper yoke 42T2 is located farther from the top surface 51a of the substrate 51 than the resistor section Rz2. When viewed from above, the resistor section Rz2 lies between the upper yoke 42T2 and the lower yoke 42B2.

The upper yoke 42T3 and the lower yoke 42B3 are located near the resistor section Rz3. The lower yoke 42B3 is located closer to the top surface 51a of the substrate 51 than the resistor section Rz3. The upper yoke 42T3 is located farther from the top surface 51a of the substrate 51 than the resistor section Rz3. When viewed from above, the resistor section Rz3 lies between the upper yoke 42T3 and the lower yoke 42B3.

The upper yoke 42T4 and the lower yoke 42B4 are located near the resistor section Rz4. The lower yoke 42B4 is located closer to the top surface 51a of the substrate 51 than the resistor section Rz4. The upper yoke 42T4 is located farther from the top surface 51a of the substrate 51 than the resistor section Rz4. When viewed from above, the resistor section Rz4 lies between the upper yoke 42T4 and the lower yoke 42B4.

The output magnetic field component outputted by the magnetic-field conversion section 42 includes: a magnetic field component generated by the upper yoke 42T1 and the lower yoke 42B1 for application to the resistor section Rz1; a magnetic field component generated by the upper yoke 42T2 and the lower yoke 42B2 for application to the resistor section Rz2; a magnetic field component generated by the upper yoke 42T3 and the lower yoke 42B3 for application to the resistor section Rz3; and a magnetic field component generated by the upper yoke 42T4 and the lower yoke 42B4 for application to the resistor section Rz4.

Figure 8:
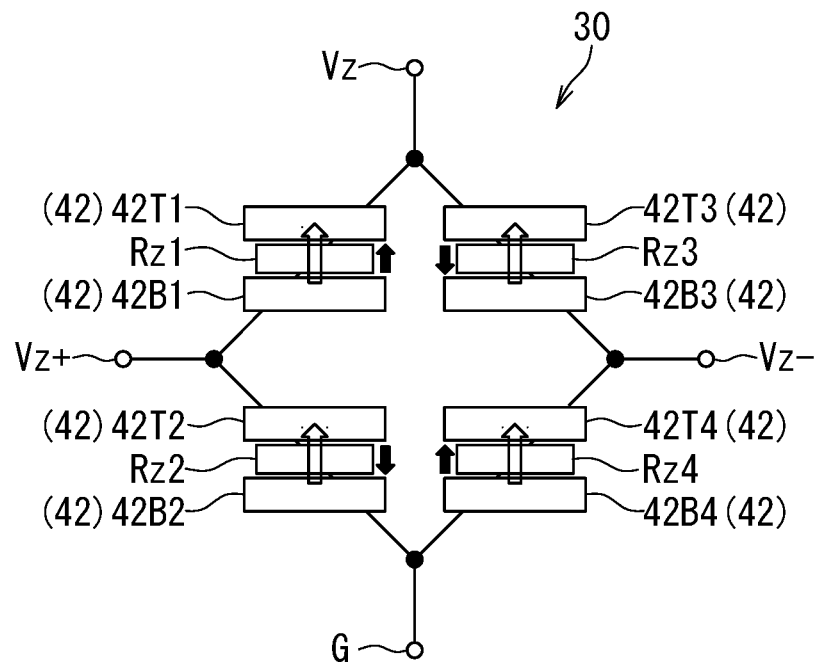
FIG. 8 is an explanatory diagram illustrating an example configuration of a magnetic-field conversion section of the magnetic sensor according to the first embodiment of the invention.

In FIG. 8, the four hollow arrows indicate the directions of the magnetic field components applied respectively to the resistor sections Rz1, Rz2, Rz3 and Rz4 when the input magnetic field component is in the Z direction. In FIG. 8, the four filled arrows indicate the magnetization directions of the magnetization pinned layers 102 of the MR elements 100 in the resistor sections Rz1, Rz2, Rz3 and Rz4, respectively. The magnetization directions of the magnetization pinned layers 102 of the MR elements 100 in the resistor sections Rz1 and Rz4 are the same as the directions of the magnetic field components applied to the resistor sections Rz1 and Rz4, respectively, when the input magnetic field component is in the Z direction. The magnetization directions of the magnetization pinned layers 102 of the MR elements 100 in the resistor sections Rz2 and Rz3 are opposite to the directions of the magnetic field components applied to the resistor sections Rz2 and Rz3, respectively, when the input magnetic field component is in the Z direction.

The operation of the third detection unit 30 will now be described. In each MR element 100 in the resistor sections Rz1, Rz2, Rz3 and Rz4, the magnetization direction of the free layer 104 when there is no input magnetic field component is perpendicular to the magnetization direction of the magnetization pinned layer 102.

When the input magnetic field component is in the Z direction, the magnetization direction of the free layer 104 in each MR element 100 in the resistor sections Rz1 and Rz4 is inclined from the direction perpendicular to the magnetization direction of the magnetization pinned layer 102 toward the magnetization direction of the magnetization pinned layer 102. On the other hand, in each MR element 100 in the resistor sections Rz2 and Rz3, the magnetization direction of the free layer 104 is inclined from the direction perpendicular to the magnetization direction of the magnetization pinned layer 102 toward the direction opposite to the magnetization direction of the magnetization pinned layer 102. As a result, the resistance values of the resistor sections Rz1 and Rz4 decrease while the resistance values of the resistor sections Rz2 and Rz3 increase, as compared with the state where there is no input magnetic field component.

When the input magnetic field component is in the −Z direction, conversely to the above situation, the resistance values of the resistor sections Rz1 and Rz4 increase while the resistance values of the resistor sections Rz2 and Rz3 decrease, as compared with the state where there is no input magnetic field component.

The amount of change in the resistance value of each of the resistor sections Rz1, Rz2, Rz3 and Rz4 depends on the strength of the input magnetic field component.

Changes in the direction and strength of the input magnetic field component cause the resistance values of the resistor sections Rz1, Rz2, Rz3 and Rz4 to change such that the resistance values of the resistor sections Rz1 and Rz4 increase while the resistance values of the resistor sections Rz2 and Rz3 decrease, or such that the resistance values of the resistor sections Rz1 and Rz4 decrease while the resistance values of the resistor sections Rz2 and Rz3 increase. This causes a change in the potential difference between the output terminal Vz+ and the output terminal Vz−. The input magnetic field component can thus be detected based on the potential difference.

Figure 9:
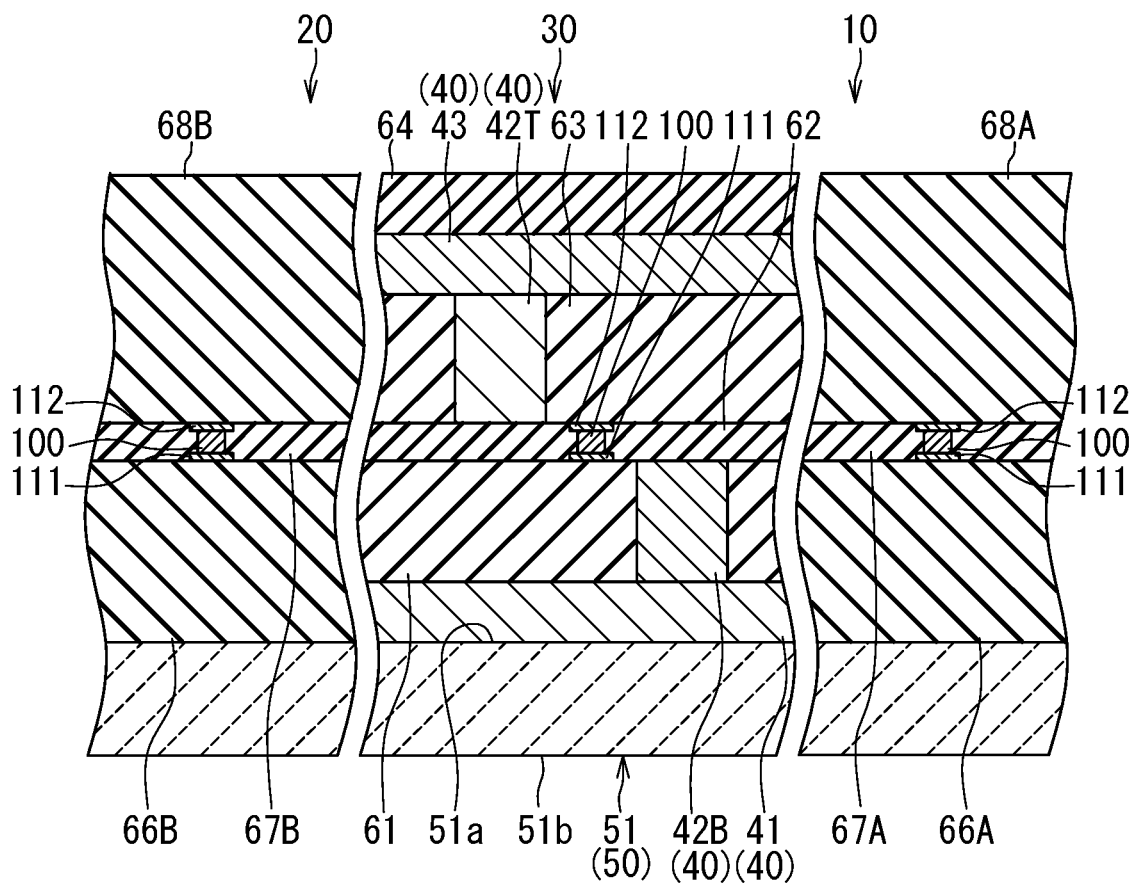
FIG. 9 is a cross-sectional view illustrating respective portions of the first to third detection units of the magnetic sensor according to the first embodiment of the invention.

Reference is now made to FIG. 9 to describe an example of configurations of the first to third detection units 10, 20 and 30. FIG. 9 illustrates respective portions of the first to third detection units 10, 20 and 30. In this example, the first to third detection units 10, 20 and 30 are disposed on the substrate 51. The substrate 51 has the top surface 51a and the bottom surface 51b.

The first detection unit 10 includes insulating layers 66A, 67A and 68A each formed of an insulating material, in addition to the resistor sections Rx1, Rx2, Rx3 and Rx4. The insulating layer 66A lies on the top surface 51a of the substrate 51. The resistor sections Rx1, Rx2, Rx3 and Rx4 are disposed on the insulating layer 66A. FIG. 9 illustrates one of the MR elements 100 included in the resistor sections Rx1, Rx2, Rx3 and Rx4, and the upper and lower connection layers 112 and 111 connected to the MR element 100. The insulating layer 67A lies on the top surface 51a of the substrate 51 and surrounds the resistor sections Rx1, Rx2, Rx3 and Rx4. The insulating layer 68A covers the resistor sections Rx1, Rx2, Rx3 and Rx4 and the insulating layer 67A.

The second detection unit 20 has a configuration similar to that of the first detection unit 10. To be more specific, the second detection unit 20 includes insulating layers 66B, 67B and 68B each formed of an insulating material, in addition to the resistor sections Ry1, Ry2, Ry3 and Ry4. The insulating layer 66B lies on the top surface 51a of the substrate 51. The resistor sections Ry1, Ry2, Ry3 and Ry4 are disposed on the insulating layer 66B. FIG. 9 illustrates one of the MR elements 100 included in the resistor sections Ry1, Ry2, Ry3 and Ry4, and the upper and lower connection layers 112 and 111 connected to the MR element 100. The insulating layer 67B lies on the top surface 51a of the substrate 51 and surrounds the resistor sections Ry1, Ry2, Ry3 and Ry4. The insulating layer 68B covers the resistor sections Ry1, Ry2, Ry3 and Ry4 and the insulating layer 67B.

The third detection unit 30 includes insulating layers 61, 62, 63 and 64 each formed of an insulating material, in addition to the resistor sections Rz1, Rz2, Rz3 and Rz4 and the soft magnetic structure 40. In the example shown in FIG. 9, the soft magnetic structure 40 includes the magnetic-field conversion section 42 and two soft magnetic layers 41 and 43.

The magnetic-field conversion section 42 includes the upper yokes 42T1, 42T2, 42T3 and 42T4 and the lower yokes 42B1, 42B2, 42B3 and 42B4, all of which are shown in FIG. 8. In FIG. 9, the reference sign 42B represents one of the lower yokes 42B1, 42B2, 42B3 and 42B4, and the reference sign 42T represents a corresponding one of the upper yokes 42T1, 42T2, 42T3 and 42T4.

The soft magnetic layer 41 lies on the top surface 51a of the substrate 51. The lower yokes 42B1, 42B2, 42B3 and 42B4 are disposed on the soft magnetic layer 41. The insulating layer 61 lies on the soft magnetic layer 41 and surrounds the lower yokes 42B1, 42B2, 42B3 and 42B4.

The resistor sections Rz1, Rz2, Rz3 and Rz4 are disposed on the insulating layer 61. FIG. 9 illustrates one of the MR elements 100 included in the resistor sections Rz1, Rz2, Rz3 and Rz4, and the upper and lower connection layers 112 and 111 connected to the MR element 100. The insulating layer 62 lies on the lower yokes 42B1, 42B2, 42B3 and 42B4 and the insulating layer 61, and surrounds the resistor sections Rz1, Rz2, Rz3 and Rz4.

The upper yokes 42T1, 42T2, 42T3 and 42T4 are disposed on the insulating layer 62. The insulating layer 63 lies on the resistor sections Rz1, Rz2, Rz3 and Rz4 and the insulating layer 62, and surrounds the upper yokes 42T1, 42T2, 42T3 and 42T4.

The soft magnetic layer 43 lies on the upper yokes 42T1, 42T2, 42T3 and 42T4 and the insulating layer 63. The insulating layer 64 covers the soft magnetic layer 43.

As viewed from above, the soft magnetic layers 41 and 43 lie over the entire region or substantially the entire region of the third detection unit 30. In other words, both of a region formed by vertically projecting the soft magnetic layer 41 onto the top surface 51a of the substrate 51, i.e., the reference plane RP, and a region formed by vertically projecting the soft magnetic layer 43 onto the reference plane RP coincide or substantially coincide with the third region A30.

In the example shown in FIG. 9, all the magnetic detection elements or MR elements 100 included in the first to third detection units 10, 20 and 30 are located at equal distances from the top surface 51a of the substrate 51, i.e., the reference plane RP.

The magnetic-field conversion section 42 may include only either the upper yokes 42T1, 42T2, 42T3 and 42T4 or the lower yokes 42B1, 42B2, 42B3 and 42B4. The soft magnetic structure 40 may include only either one of the soft magnetic layers 41 and 43.

The operation and effect of the magnetic sensor 1 according to the present embodiment will now be described. In the magnetic sensor 1 according to the present embodiment, the first detection unit 10 detects the first component, i.e., the component in a direction parallel to the first direction (the X direction), of an external magnetic field. The second detection unit 20 detects the second component, i.e., the component in a direction parallel to the second direction (the Y direction), of the external magnetic field. Hereinafter, a direction parallel to the first direction (the X direction) will also be referred to as the magnetosensitive direction of the first detection unit 10, and a direction parallel to the second direction (the Y direction) will also be referred to as the magnetosensitive direction of the second detection unit 20. In the present embodiment, the first straight line L1 is parallel to the magnetosensitive direction of the first detection unit 10, and the second straight line L2 is parallel to the magnetosensitive direction of the second detection unit 20.

The third detection unit 30 detects the input magnetic field component, i.e., the component in a direction parallel to the third direction (the Z direction) of the external magnetic field, by the above-described action. The third detection unit 30 includes the soft magnetic structure 40. The soft magnetic structure 40 includes the magnetic-field conversion section 42 and the two soft magnetic layers 41 and 43. The soft magnetic structure 40 acts to concentrate a magnetic flux corresponding to a magnetic field in a direction parallel to the reference plane RP. The soft magnetic structure 40 affects the magnetic field to be applied to each of the first and second detection units 10 and 20. Thus, depending on the layout of the first to third detection units 10, 20 and 30, the output characteristics of the first and second detection units 10 and 20 may differ greatly due to the soft magnetic structure 40.

The first and second detection units 10 and 20 include MR elements. Each MR element contains a magnetic material. Thus, each of the first and second detection units 10 and 20 also acts to concentrate a magnetic flux corresponding to a magnetic field in a direction parallel to the reference plane RP. As a result, depending on the layout of the first to third detection units 10, 20 and 30, the characteristics of the first and second detection units 10 and 20 may be degraded relative to their respective characteristics as designed.

In the present embodiment, the first region A10 includes the first partial region A11 and the second partial region A12 located on opposite sides of the third region A30 in a direction parallel to the first straight line L1, and the second region A20 includes the third partial region A21 and the fourth partial region A22 located on opposite sides of the third region A30 in a direction parallel to the second straight line L2. This feature of the present embodiment makes it possible to prevent any difference between the characteristics of the first and second detection units 10 and 20 and any degradation of their characteristics from occurring due to the layout of the first to third detection units 10, 20 and 30. This will be described in detail below with reference to first and second comparative examples.

Figure 10:
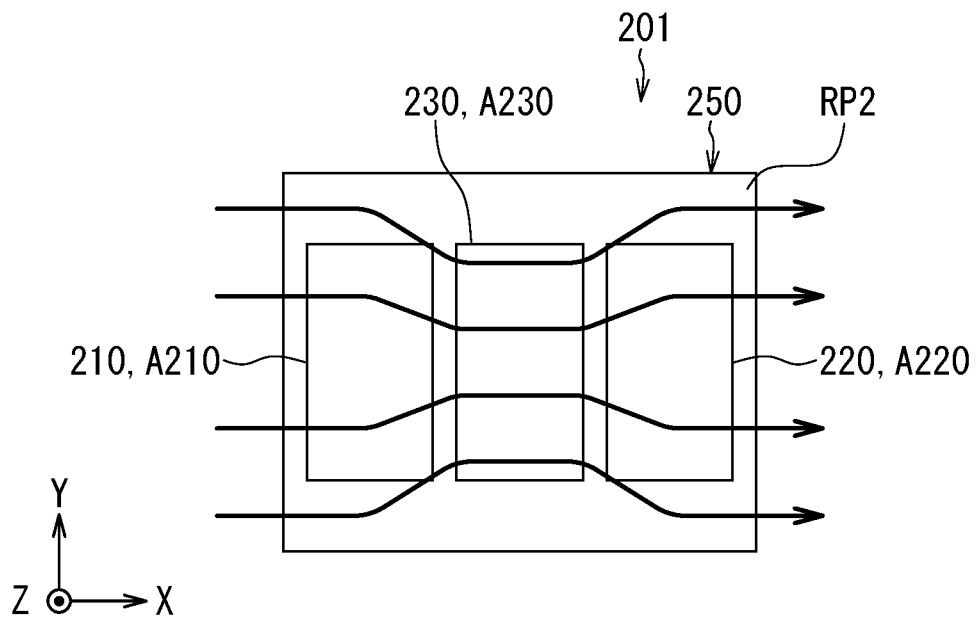
FIG. 10 is an explanatory diagram illustrating how an external magnetic field in an X direction is applied to a magnetic sensor of a first comparative example.
Figure 11:
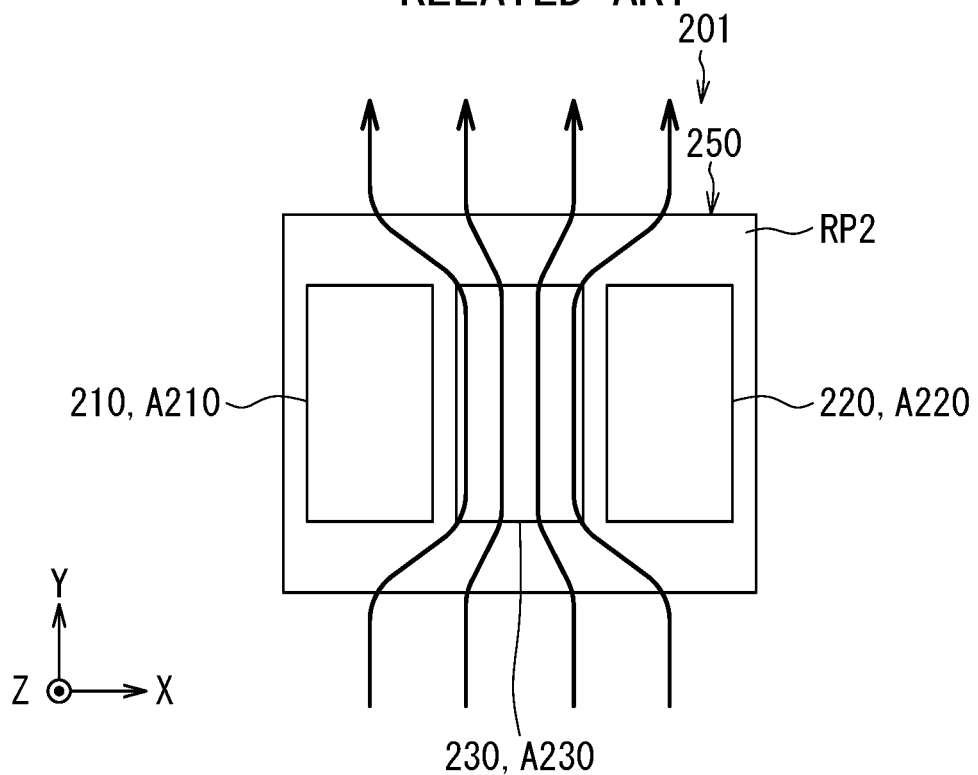
FIG. 11 is an explanatory diagram illustrating how an external magnetic field in a Y direction is applied to the magnetic sensor of the first comparative example.

FIG. 10 and FIG. 11 illustrate a schematic configuration of a magnetic sensor 201 of the first comparative example. The magnetic sensor 201 includes: a first detection unit 210 for detecting a first component of an external magnetic field, the first component being in a direction parallel to the first direction (the X direction); a second detection unit 220 for detecting a second component of the external magnetic field, the second component being in a direction parallel to the second direction (the Y direction); a third detection unit 230 for detecting a third component of the external magnetic field, the third component being in a direction parallel to the third direction (the Z direction); and a support 250. Hereinafter, a direction parallel to the first direction (the X direction) may also be referred to as the magnetosensitive direction of the first detection unit 210, and a direction parallel to the second direction (the Y direction) may also be referred to as the magnetosensitive direction of the second detection unit 220. Although not illustrated, the third detection unit 230 includes a magnetic-field conversion section similar to the magnetic-field conversion section 42 of the present embodiment. This magnetic-field conversion section corresponds to the soft magnetic structure.

The support 250 has a reference plane RP2 orthogonal to the third direction (the Z direction). The reference plane RP2 includes three different regions: a first region A210; a second region A220; and a third region A230. The first region A210 is a region formed by vertically projecting the first detection unit 210 onto the reference plane RP2. The second region A220 is a region formed by vertically projecting the second detection unit 220 onto the reference plane RP2. The third region A230 is a region formed by vertically projecting the third detection unit 230 onto the reference plane RP2.

The first region A210, the third region A230, and the second region A220 are arranged in this order along the first direction (the X direction).

FIG. 10 illustrates how an external magnetic field in the X direction is applied to the magnetic sensor 201. FIG. 11 illustrates how an external magnetic field in the Y direction is applied to the magnetic sensor 201. In FIG. 10 and FIG. 11, the curves with arrows schematically represent a magnetic flux in the vicinity of the third region A230. As shown in FIG. 10 and FIG. 11, the magnetic-field conversion section included in the third detection unit 230 acts to concentrate a magnetic flux corresponding to a magnetic field in a direction parallel to the reference plane RP2.

Due to the foregoing action of the magnetic-field conversion section, the first detection unit 210 becomes higher in magnetic flux density when subjected to an external magnetic field in the magnetosensitive direction of the first detection unit 210 (see FIG. 10) than when subjected to an external magnetic field in a direction orthogonal to the magnetosensitive direction of the first detection unit 210 (see FIG. 11). In contrast, the second detection unit 220 becomes lower in magnetic flux density when subjected to an external magnetic field in the magnetosensitive direction of the second detection unit 220 (see FIG. 11) than when subjected to an external magnetic field in a direction orthogonal to the magnetosensitive direction of the second detection unit 220 (see FIG. 10). As a result, the first detection unit 210 and the second detection unit 220 differ greatly in output characteristic, more specifically, the characteristic of a change in output with respect to a change in the angle between the direction of the external magnetic field and the magnetosensitive direction.

Figure 12:
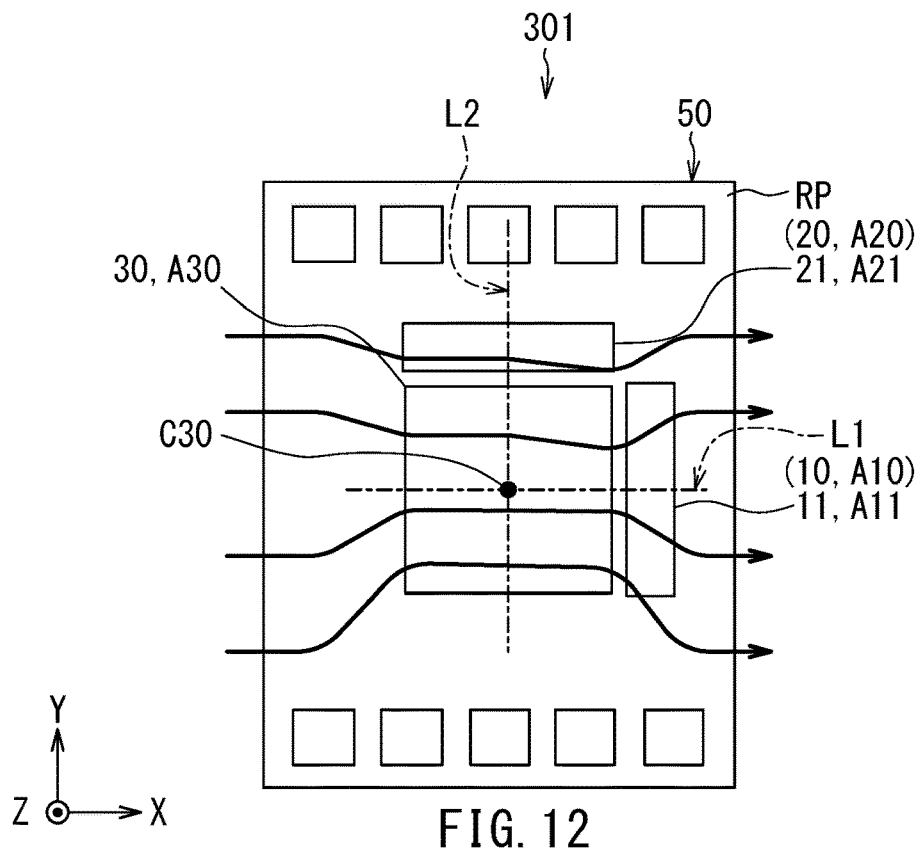
FIG. 12 is an explanatory diagram illustrating how an external magnetic field in the X direction is applied to a magnetic sensor of a second comparative example.
Figure 13:
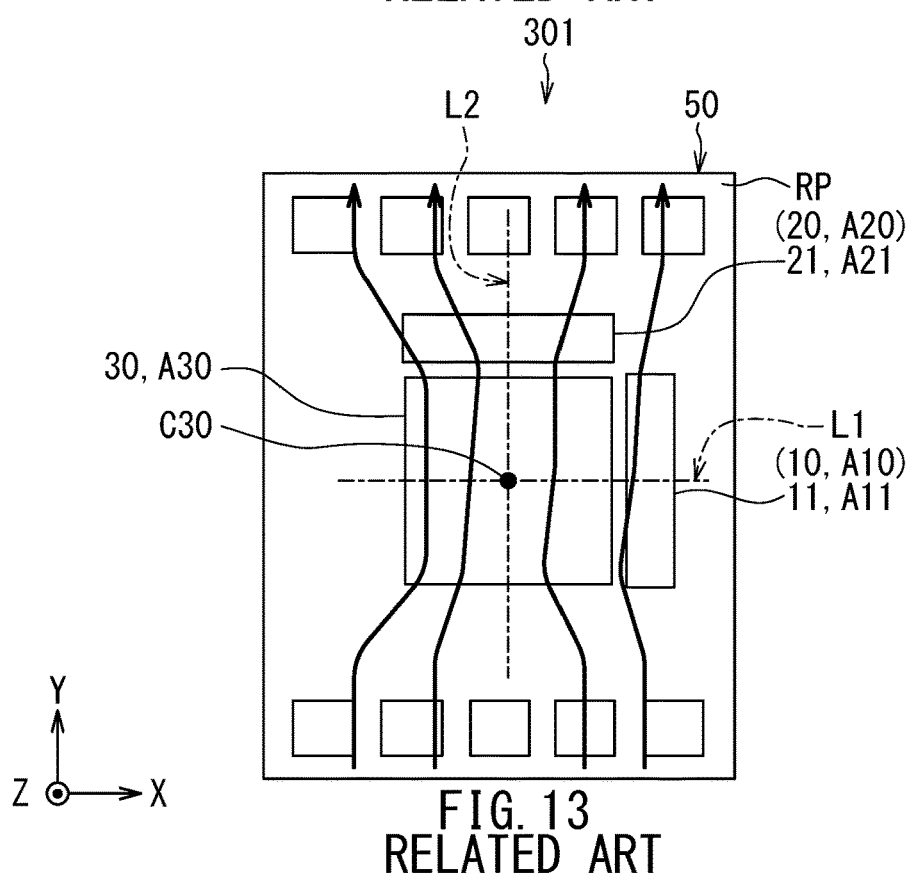
FIG. 13 is an explanatory diagram illustrating how an external magnetic field in the Y direction is applied to the magnetic sensor of the second comparative example.

FIG. 12 and FIG. 13 illustrate a schematic configuration of a magnetic sensor 301 of the second comparative example. The magnetic sensor 301 differs from the magnetic sensor 1 according to the present embodiment in the following ways. In the magnetic sensor 301, the first detection unit 10 consists only of the first portion 11 and does not include the second portion 12. Accordingly, the first region A10 consists only of the first partial region A11 and does not include the second partial region A12. Further, the second detection unit 20 consists only of the first portion 21 and does not include the second portion 22. Accordingly, the second region A20 consists only of the third partial region A21 and does not include the fourth partial region A22.

Thus, in the magnetic sensor 301 the first region A10 is present only on one side of the third region A30 in a direction parallel to the first straight line L1, and the second region A20 is present only on one side of the third region A30 in a direction parallel to the second straight line L2. In other words, the first region A10 is present only on one side of the second straight line L2, and the second region A20 is present only on one side of the first straight line L1. The first detection unit 10 is present only on one side of a YZ plane including the second straight line L2, and the second detection unit 20 is present only on one side of an XZ plane including the first straight line L1.

FIG. 12 illustrates how an external magnetic field in the X direction is applied to the magnetic sensor 301. FIG. 13 illustrates how an external magnetic field in the Y direction is applied to the magnetic sensor 301. In FIG. 12 and FIG. 13, the curves with arrows schematically represent a magnetic flux in the vicinity of the third region A30.

As shown in FIG. 12, when an external magnetic field in the X direction is applied to the magnetic sensor 301, the direction and density of the magnetic flux in the vicinity of the third region A30 are asymmetrical with respect to the XZ plane including the first straight line L1. This is because the second detection unit 20 which acts to concentrate a magnetic flux is present only on one side of the XZ plane including the first straight line L1.

The first detection unit 10 can be divided into two portions by the XZ plane including the first straight line L1. Under the condition shown in FIG. 12, the magnetic field in the two portions of the first detection unit 10 is asymmetrical with respect to the XZ plane including the first straight line L1. If the first detection unit 10 is designed on the assumption that a magnetic field that is symmetrical with respect to the XZ plane including the first straight line L1 is to be applied to the two portions of the first detection unit 10, the condition shown in FIG. 12 may cause the first detection unit 10 to have a degraded characteristic under application of the external magnetic field in the X direction, relative to the characteristic as designed.

As shown in FIG. 13, when an external magnetic field in the Y direction is applied to the magnetic sensor 301, the direction and density of the magnetic flux in the vicinity of the third region A30 are asymmetrical with respect to the YZ plane including the second straight line L2. This is because the first detection unit 10 which acts to concentrate a magnetic flux is present only on one side of the YZ plane including the second straight line L2.

The second detection unit 20 can be divided into two portions by the YZ plane including the second straight line L2. Under the condition shown in FIG. 13, the magnetic field in the two portions of the second detection unit 20 is asymmetrical with respect to the YZ plane including the second straight line L2. If the second detection unit 20 is designed on the assumption that a magnetic field that is symmetrical with respect to the YZ plane including the second straight line L2 is to be applied to the two portions of the second detection unit 20, the condition shown in FIG. 13 may cause the second detection unit 20 to have a degraded characteristic under application of the external magnetic field in the Y direction, relative to the characteristic as designed.

Figure 14:
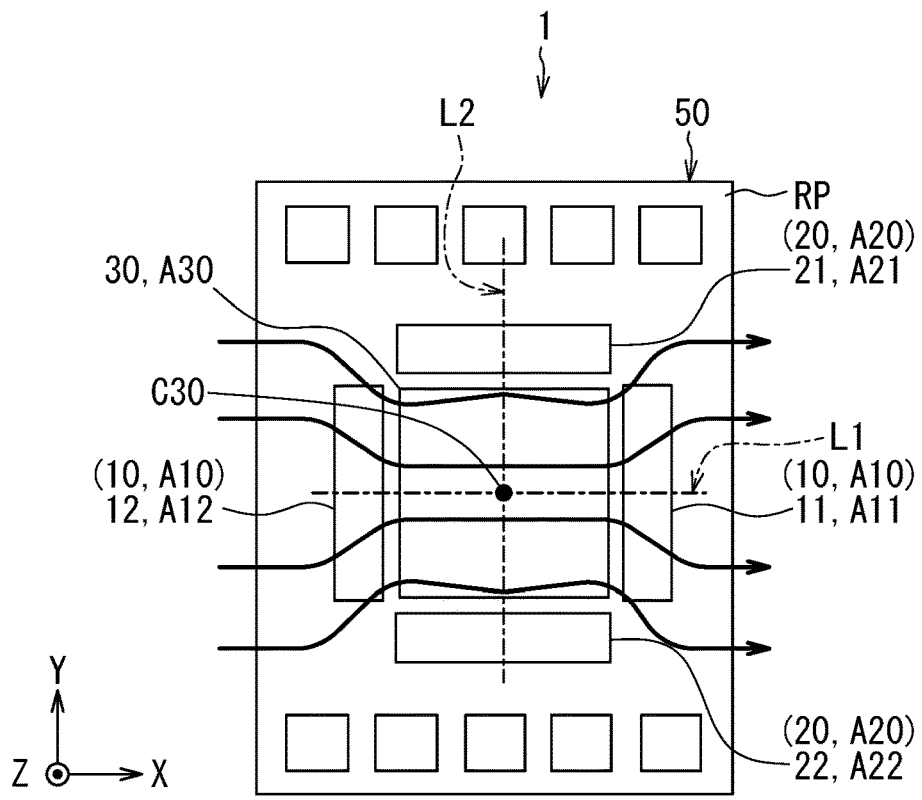
FIG. 14 is an explanatory diagram illustrating how an external magnetic field in the X direction is applied to the magnetic sensor according to the first embodiment of the invention.
Figure 15:
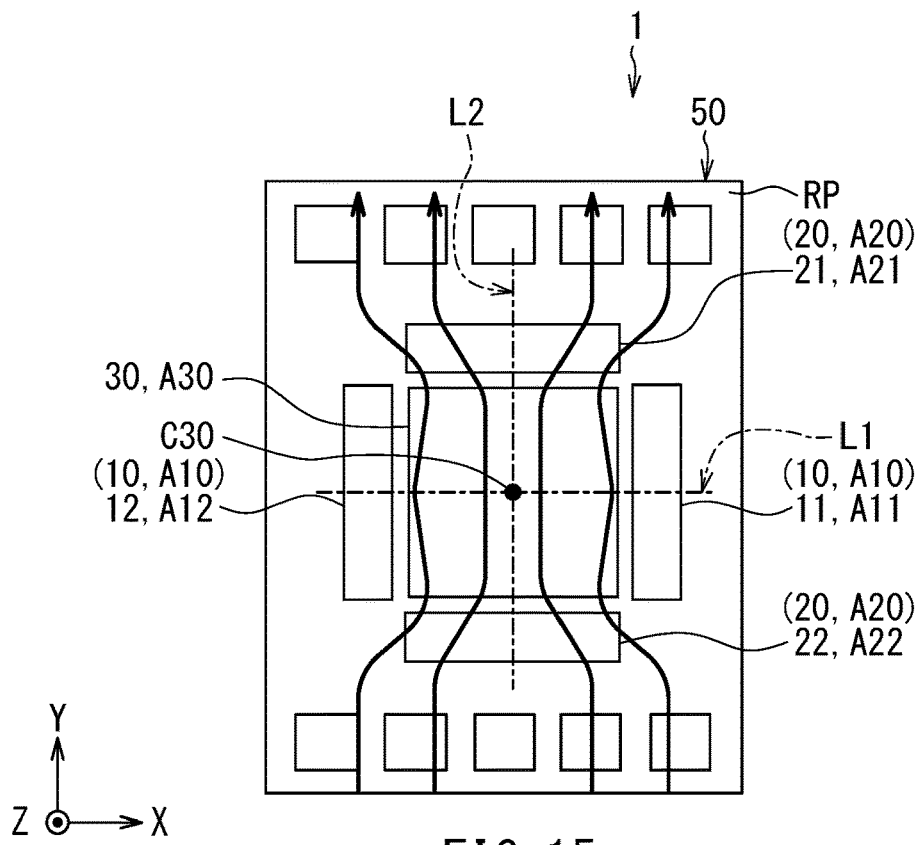
FIG. 15 is an explanatory diagram illustrating how an external magnetic field in the Y direction is applied to the magnetic sensor according to the first embodiment of the invention.

Reference is now made to FIG. 14 and FIG. 15 to describe how an external magnetic field in the X direction and an external magnetic field in the Y direction are applied to the magnetic sensor 1 according to the present embodiment. FIG. 14 illustrates how an external magnetic field in the X direction is applied to the magnetic sensor 1. FIG. 15 illustrates how an external magnetic field in the Y direction is applied to the magnetic sensor 1. In FIG. 14 and FIG. 15, the curves with arrows schematically represent a magnetic flux in the vicinity of the third region A30.

First, a description will be given of the effect of the present embodiment in comparison with the first comparative example. As mentioned previously, the soft magnetic structure 40 included in the third detection unit 30 acts to concentrate a magnetic flux corresponding to a magnetic field in a direction parallel to the reference plane RP.

In the magnetic sensor 1 according to the present embodiment, due to the foregoing action of the soft magnetic structure 40, the first detection unit 10 becomes higher in magnetic flux density when subjected to an external magnetic field in the magnetosensitive direction of the first detection unit 10 (see FIG. 14) than when subjected to an external magnetic field in a direction orthogonal to the magnetosensitive direction of the first detection unit 10 (see FIG. 15). Similarly, the second detection unit 20 becomes higher in magnetic flux density when subjected to an external magnetic field in the magnetosensitive direction of the second detection unit 20 (see FIG. 15) than when subjected to an external magnetic field in a direction orthogonal to the magnetosensitive direction of the second detection unit 20 (see FIG. 14). As a result, the first detection unit 10 and the second detection unit 20 are the same or almost the same in the output characteristic, more specifically, the characteristic of a change in output with respect to a change in the angle between the direction of the external magnetic field and the magnetosensitive direction. The present embodiment thus prevents the first and second detection units 10 and 20 from having different output characteristics due to the soft magnetic structure 40.

The above-described effect is exerted noticeably by virtue of the feature that when viewed in the third direction (the Z direction), the first region A10 and the second region A20 have such a positional relationship that the first region A10 coincides with the second region A20 if the first region A10 is rotated 90° about the centroid C30 of the third region A30.

The foregoing effect is also exerted noticeably by virtue of the feature that all the magnetic detection elements, i.e., the MR elements 100, included in the first to third detection units 10, 20 and 30 are located at equal distances from the top surface 51a of the substrate 51, i.e., the reference plane RP.

In the present embodiment, the action of the soft magnetic structure 40 increases the magnetic flux density in each of the first and second detection units 10 and 20 under application of an external magnetic field in the magnetosensitive direction. This enables enhancement of the sensitivity of each of the first and second detection units 10 and 20. This effect is exerted noticeably by the inclusion of at least one of the the soft magnetic layers 41 and 43 in the soft magnetic structure 40.

Next, a description will be given of the effect of the present embodiment in comparison with the second comparative example. In the present embodiment, the first region A10 includes the first and second partial regions A11 and A12. The first and second partial regions A11 and A12 are located on opposite sides of the third region A30 in a direction parallel to the first straight line L1. In other words, the first and second partial regions A11 and A12 are opposite to each other with the second straight line L2 therebetween. The first and second portions 11 and 12 of the first detection unit 10 are opposite to each other with a YZ plane including the second straight line L2 therebetween.

The second region A20 includes the third and fourth partial regions A21 and A22. The third and fourth partial regions A21 and A22 are located on opposite sides of the third region A30 in a direction parallel to the second straight line L2. In other words, the third and fourth partial regions A21 and A22 are opposite to each other with the first straight line L1 therebetween. The first and second portions 21 and 22 of the second detection unit 20 are opposite to each other with an XZ plane including the first straight line L1 therebetween.

By virtue of such features, in the present embodiment, when an external magnetic field in the X direction is applied to the magnetic sensor 1, as shown in FIG. 14, the direction and density of the magnetic flux in the vicinity of the third region A30 are symmetrical or almost symmetrical with respect to the XZ plane including the first straight line L1. As shown in FIG. 15, when an external magnetic field in the Y direction is applied to the magnetic sensor 1, the direction and density of the magnetic flux in the vicinity of the third region A30 are symmetrical or almost symmetrical with respect to the YZ plane including the second straight line L2. The present embodiment thus prevents the characteristics of the first and second detection units 10 and 20 from being degraded relative to their respective characteristics as designed.

The foregoing effect is exerted noticeably by virtue of the feature that each of the first and second partial regions A11 and A12 has a symmetrical shape with respect to the first straight line L1 and each of the third and fourth partial regions A21 and A22 has a symmetrical shape with respect to the second straight line L2.

As has been described, the present embodiment prevents differences between the characteristics of the first and second detection units 10 and 20 and degradation of their characteristics resulting from the layout of the first to third detection units 10, 20 and 30.

Second Embodiment

Figure 16:
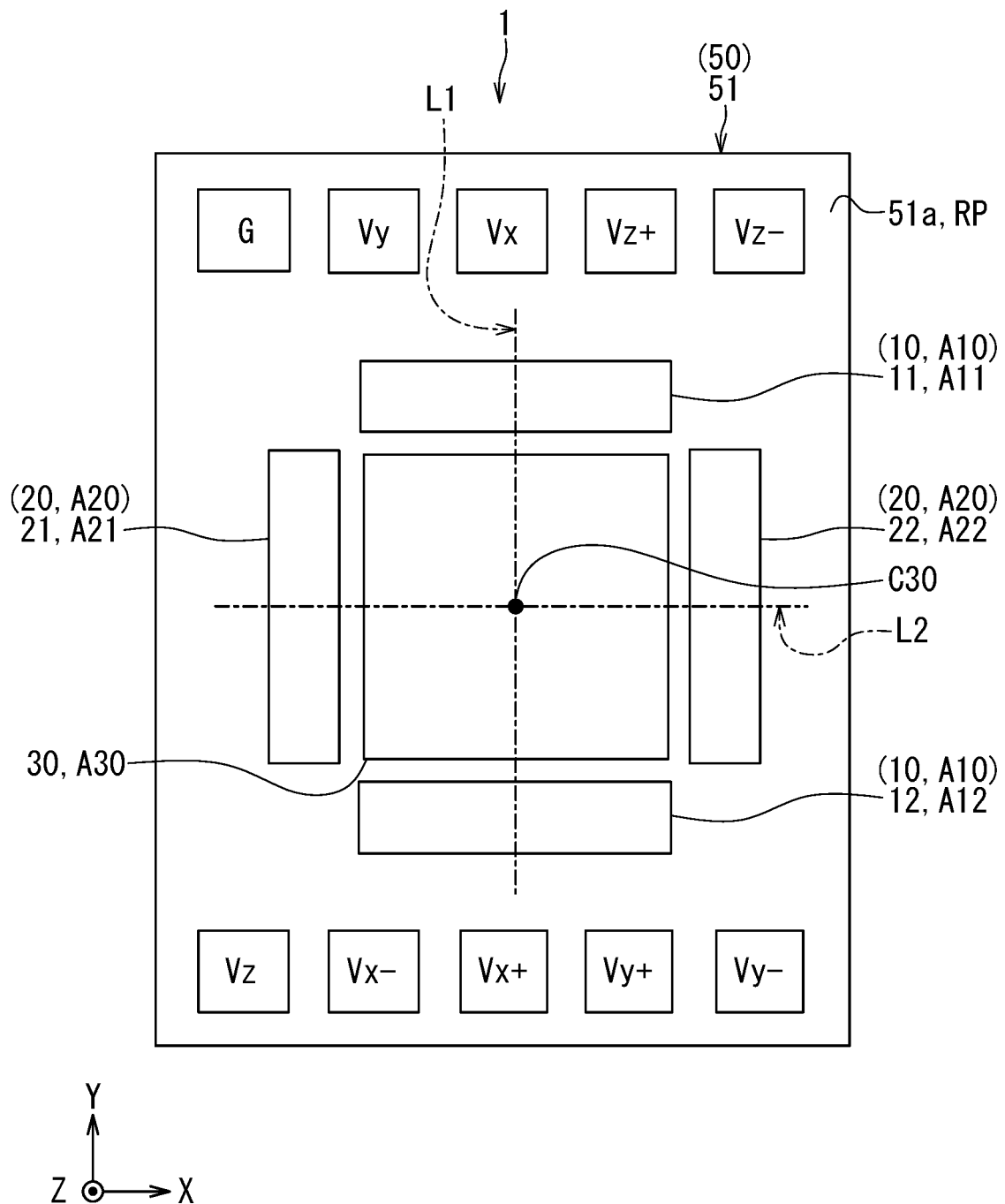
FIG. 16 is a plan view illustrating a schematic configuration of a magnetic sensor according to a second embodiment of the invention.

A second embodiment of the invention will now be described. Reference is first made to FIG. 16 to describe a schematic configuration of a magnetic sensor 1 according to the second embodiment.

In the present embodiment, the positions of the first and second detection units 10 and 20 are different from those in the first embodiment. As shown in FIG. 16, the first detection unit 10 in the present embodiment is located at such a position that the first detection unit 10 shown in FIG. 1 is rotated 90° counterclockwise about the centroid C30 of the third region A30. Accordingly, the first region A10 in the present embodiment is located at such a position that the first region A10 shown in FIG. 1 is rotated 90° counterclockwise about the centroid C30. The second detection unit 20 in the present embodiment is located at such a position that the second detection unit 20 shown in FIG. 1 is rotated 90° counterclockwise about the centroid C30. Accordingly, the second region A20 in the present embodiment is located at such a position that the second region A20 shown in FIG. 1 is rotated 90° counterclockwise about the centroid C30.

In the present embodiment, the first straight line L1, which passes through the centroid C30 and intersects the first and second partial regions A11 and A12, is parallel to the second direction (the Y direction). The second straight line L2, which passes through the centroid C30 and intersects the third and fourth partial regions A21 and A22, is parallel to the first direction (the X direction). Thus, in the present embodiment, the first straight line L1 is perpendicular to the magnetosensitive direction of the first detection unit 10, and the second straight line L2 is perpendicular to the magnetosensitive direction of the second detection unit 20.

In the present embodiment, due to the action of the soft magnetic structure 40 included in the third detection unit 30, the first detection unit 10 becomes higher in magnetic flux density when subjected to an external magnetic field in a direction orthogonal to the magnetosensitive direction of the first detection unit 10 than when subjected to an external magnetic field in the magnetosensitive direction of the first detection unit 10. Similarly, the second detection unit 20 becomes higher in magnetic flux density when subjected to an external magnetic field in a direction orthogonal to the magnetosensitive direction of the second detection unit 20 than when subjected to an external magnetic field in the magnetosensitive direction of the second detection unit 20. As a result, the first detection unit 10 and the second detection unit 20 are the same or almost the same in the output characteristic, more specifically, the characteristic of a change in output with respect to a change in the angle between the direction of the external magnetic field and the magnetosensitive direction. The present embodiment thus prevents, like the first embodiment, the first and second detection units 10 and 20 from having different output characteristics due to the soft magnetic structure 40.

Note that one of the effects of the magnetic sensor 1 according to the first embodiment, that is, the effect that the sensitivity of each of the first and second detection units 10 and 20 can be enhanced by the action of the soft magnetic structure 40, is not obtainable in the present embodiment.

The configuration, operation and effects of the present embodiment are otherwise the same as those of the first embodiment.

Third Embodiment

Figure 17:
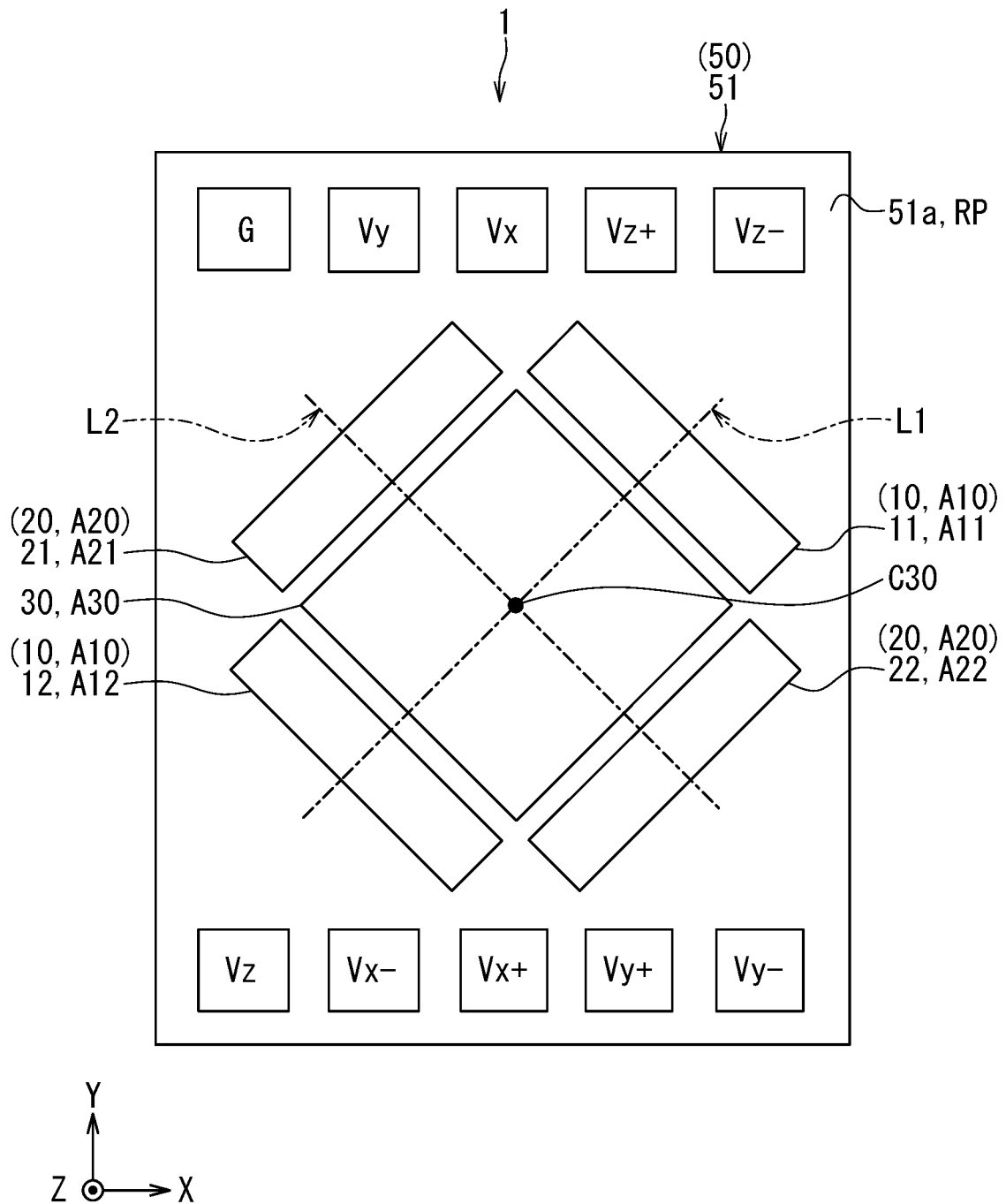
FIG. 17 is a plan view illustrating a schematic configuration of a magnetic sensor according to a third embodiment of the invention.

A third embodiment of the invention will now be described. Reference is first made to FIG. 17 to describe a schematic configuration of a magnetic sensor 1 according to the third embodiment.

The first detection unit 10, the second detection unit 20, and the third detection unit 30 in the present embodiment are respectively located at such positions that the first detection unit 10, the second detection unit 20, and the third detection unit 30 shown in FIG. 1 are rotated 45° counterclockwise about the centroid C30 of the third region A30. Accordingly, the first region A10, the second region A20, and the third region A30 in the present embodiment are respectively located at such positions that the first region A10, the second region A20, and the third region A30 shown in FIG. 1 are rotated 45° counterclockwise about the centroid C30.

As in the first embodiment, the first detection unit 10 includes the first portion 11 and the second portion 12, and the first region A10 includes the first and second partial regions A11 and A12. The second detection unit 20 includes the first portion 21 and the second portion 22, and the second region A20 includes the third and fourth partial regions A21 and A22.

In the present embodiment, the first straight line L1 passing through the centroid C30 and intersecting the first and second partial regions A11 and A12 forms an angle of 45° with the first direction (the X direction), and the second straight line L2 passing through the centroid C30 and intersecting the third and fourth partial regions A21 and A22 forms an angle of 45° with the second direction (the Y direction).

Figure 18:
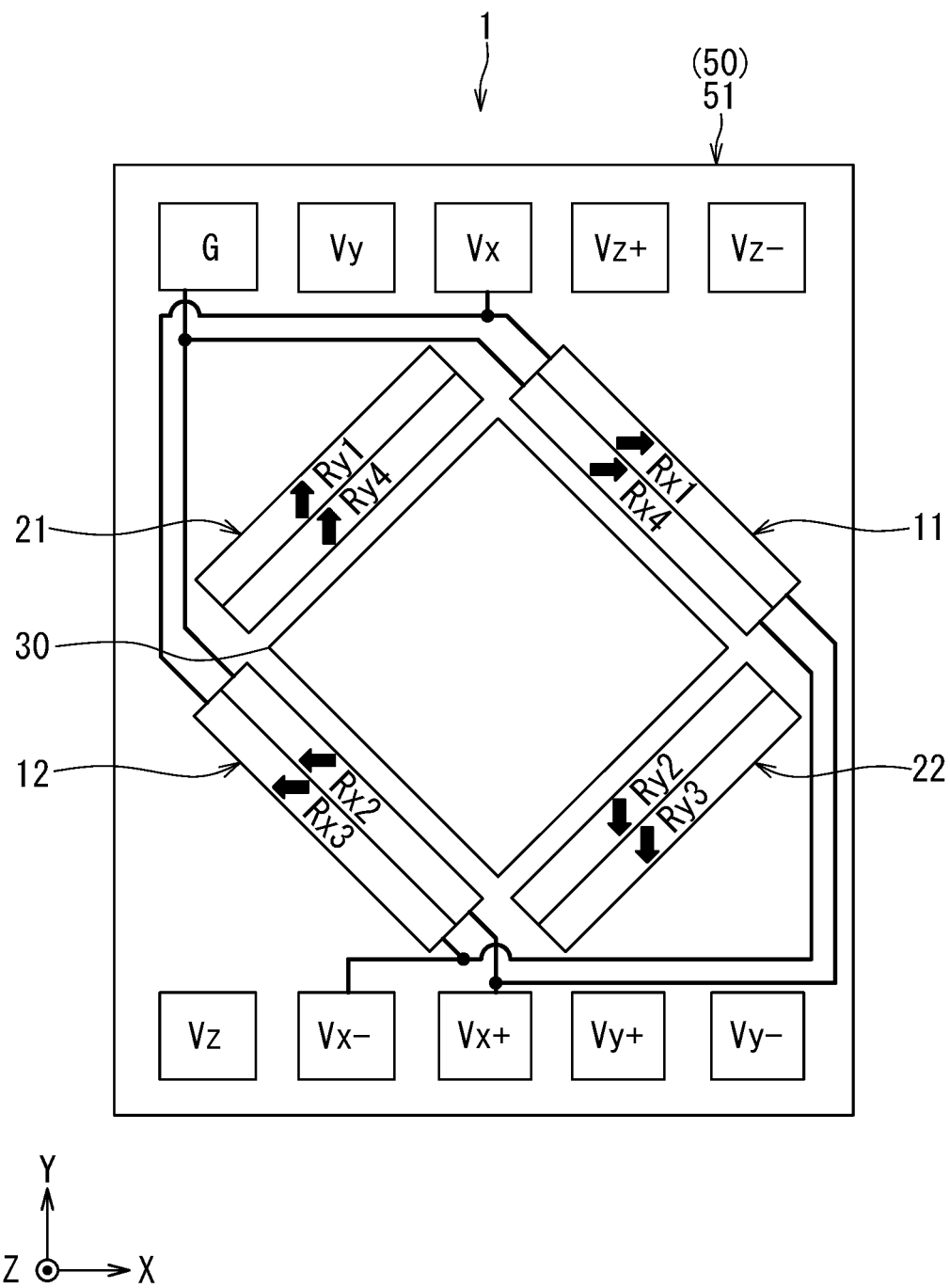
FIG. 18 is an explanatory diagram illustrating the configuration of the first and second detection units and wiring for the first detection unit of the magnetic sensor according to the third embodiment of the invention.
Figure 19:
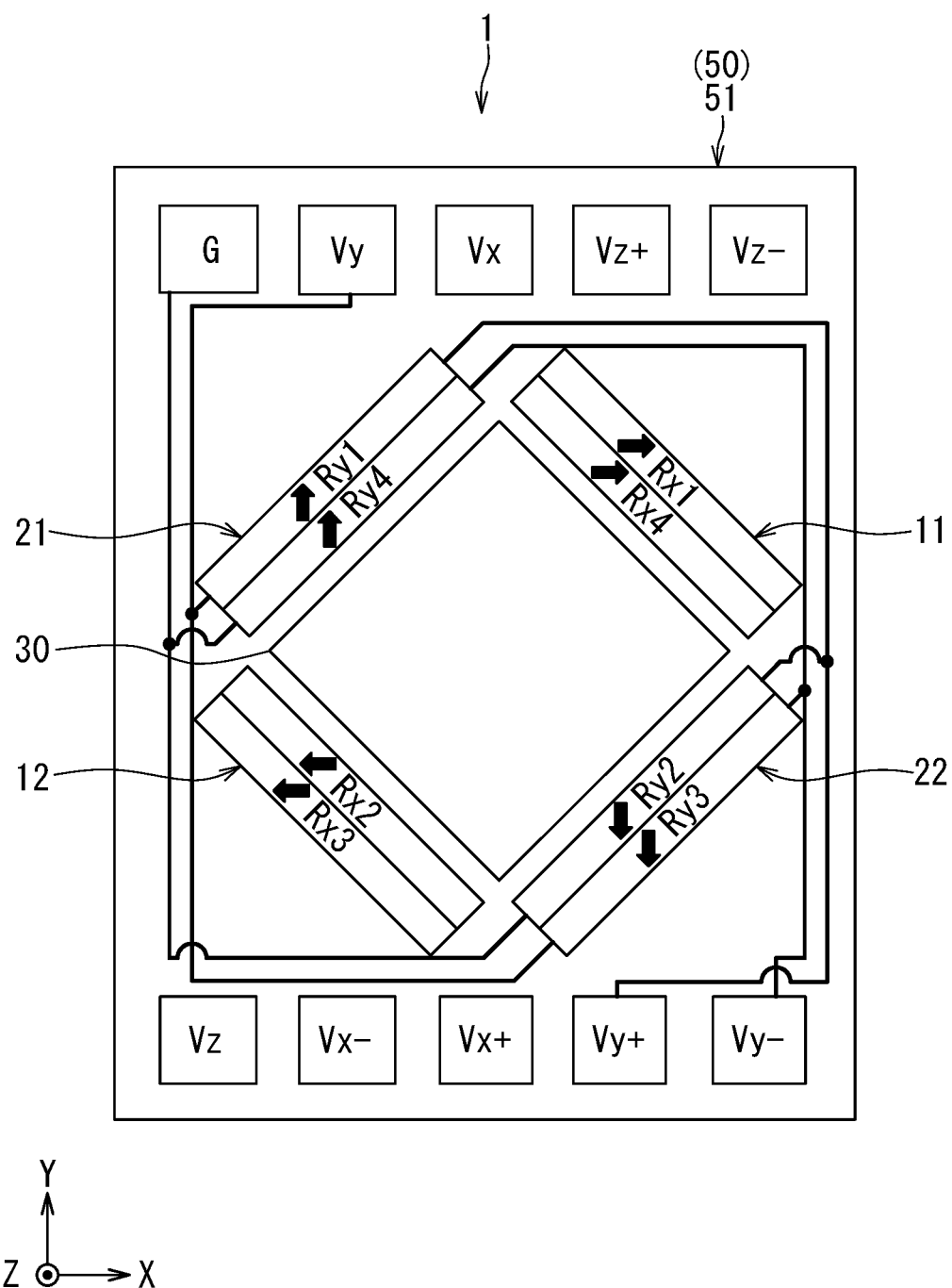
FIG. 19 is an explanatory diagram illustrating the configuration of the first and second detection units and wiring for the second detection unit of the magnetic sensor according to the third embodiment of the invention.

Now, an example of configurations of the first and second detection units 10 and 20 of the present embodiment will be described with reference to FIG. 18 and FIG. 19. In this example, as in the first embodiment, the first portion 11 of the first detection unit 10 includes the resistor sections Rx1 and Rx4, and the second portion 12 of the first detection unit 10 includes the resistor sections Rx2 and Rx3. The resistor sections Rx1, Rx2, Rx3 and Rx4 are connected to the power supply terminal Vx, the output terminals Vx+, Vx− and the ground terminal G in the same manner as in the first embodiment. FIG. 18 also illustrates wiring for the first detection unit 10.

The first portion 21 of the second detection unit 20 includes the resistor sections Ry1 and Ry4, and the second portion 22 of the second detection unit 20 includes the resistor sections Ry2 and Ry3. The resistor sections Ry1, Ry2, Ry3 and Ry4 are connected to the power supply terminal Vy, the output terminals Vy+, Vy− and the ground terminal Gin the same manner as in the first embodiment. FIG. 19 also illustrates wiring for the second detection unit 20.

The magnetization directions of the magnetization pinned layers of the MR elements in the resistor sections Rx1, Rx2, Rx3, Rx4, Ry1, Ry2, Ry3 and Ry4 are the same as those in the first embodiment. In FIG. 18 and FIG. 19, the filled arrows indicate the magnetization directions of the magnetization pinned layers of the MR elements.

In the present embodiment, the angle that the first straight line L1 forms with the magnetosensitive direction of the first detection unit 10, i.e., a direction parallel to the first direction (the X direction), is 45°. The angle that the second straight line L2 forms with the magnetosensitive direction of the second detection unit 20, i.e., a direction parallel to the second direction (the Y direction), is also 45°. By virtue of this, in the present embodiment, the first detection unit 10 and the second detection unit 20 are the same or almost the same in the output characteristic, more specifically, the characteristic of a change in output with respect to a change in the angle between the direction of the external magnetic field and the magnetosensitive direction. The present embodiment thus prevents, like the first embodiment, the first and second detection units 10 and 20 from having different output characteristics due to the soft magnetic structure 40.

The configuration, operation and effects of the present embodiment are otherwise the same as those of the first embodiment.

Fourth Embodiment

Figure 20:
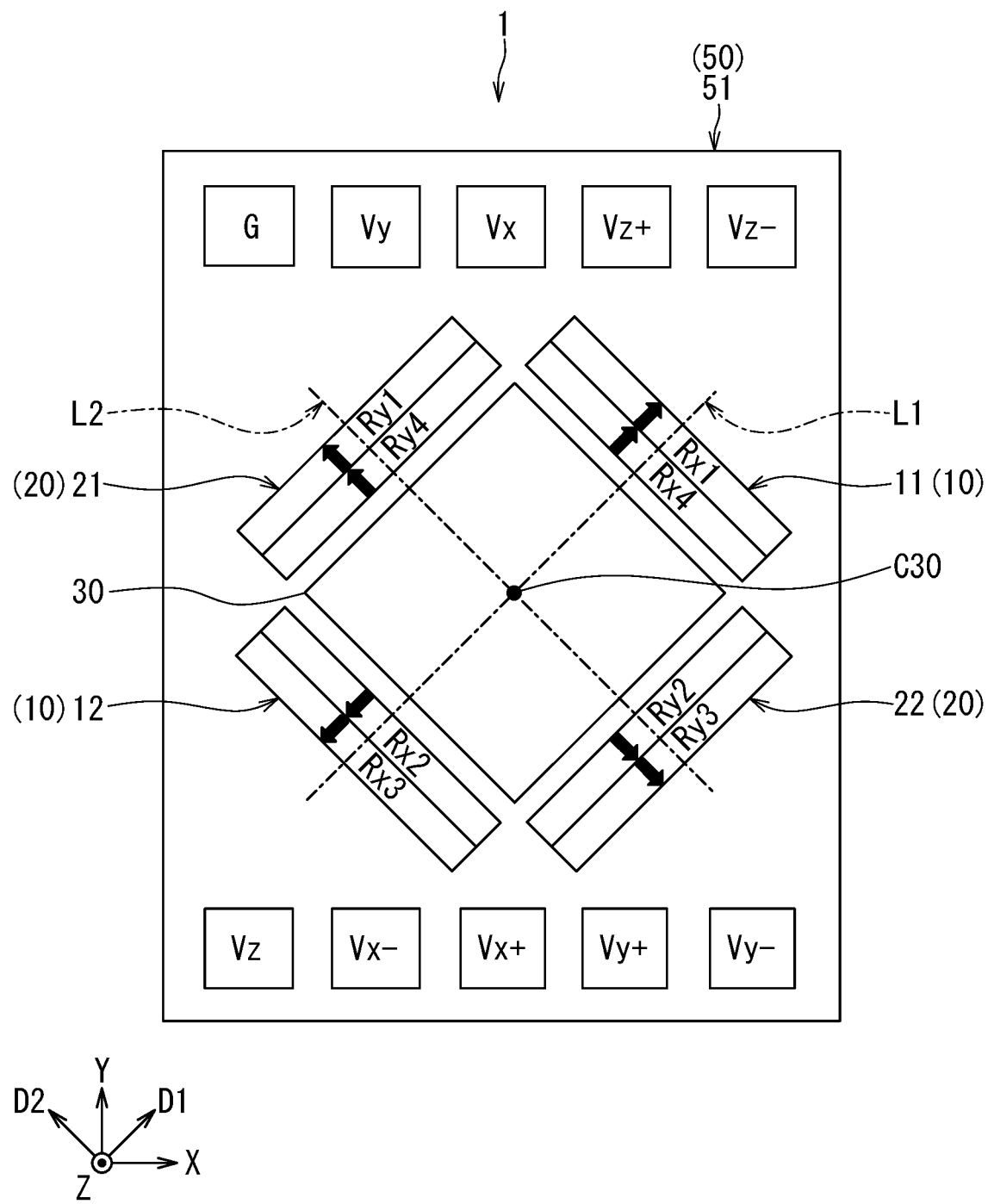
FIG. 20 is an explanatory diagram illustrating the configuration of the first and second detection units of a magnetic sensor according to a fourth embodiment of the invention.

A fourth embodiment of the invention will now be described. Reference is first made to FIG. 20 to describe differences of the magnetic sensor 1 according to the present embodiment from the magnetic sensor 1 according to the third embodiment. In the present embodiment, the first direction coincides with a direction that is rotated 45° counterclockwise in FIG. 20 from the X direction, and the second direction coincides with a direction that is rotated 45° counterclockwise in FIG. 20 from the Y direction. Hereinafter, the first direction in the present embodiment will be denoted by the symbol D1, and the second direction in the present embodiment will be denoted by the symbol D2.

In the present embodiment, the first straight line L1 is parallel to the first direction D1, and the second straight line L2 is parallel to the second direction D2.

The first detection unit 10 is configured to be capable of detecting a component in a direction parallel to the first direction D1 of an external magnetic field. Specifically, in the present embodiment, the magnetization pinned layers of the MR elements in the resistor sections Rx1 and Rx4 of the first detection unit 10 have magnetizations in the first direction D1. The magnetization pinned layers of the MR elements in the resistor sections Rx2 and Rx3 of the first detection unit 10 have magnetizations in the opposite direction to the first direction D1. In the present embodiment, a direction parallel to the first direction D1 is the magnetosensitive direction of the first detection unit 10.

The second detection unit 20 is configured to be capable of detecting a component in a direction parallel to the second direction D2 of the external magnetic field. Specifically, in the present embodiment, the magnetization pinned layers of the MR elements in the resistor sections Ry1 and Ry4 of the second detection unit 20 have magnetizations in the second direction D2. The magnetization pinned layers of the MR elements in the resistor sections Ry2 and Ry3 of the second detection unit 20 have magnetizations in the opposite direction to the second direction D2. In the present embodiment, a direction parallel to the second direction D2 is the magnetosensitive direction of the second detection unit 20.

In FIG. 20, the filled arrows indicate the magnetization directions of the magnetization pinned layers of the MR elements.

The first to third detection units 10, 20, and 30 of the present embodiment have a configuration obtained by rotating the first to third detection units 10, 20, and 30 of the first embodiment counterclockwise about the centroid C30 of the third region A30 by 45°.

Now, a description will be given of a case of detecting a component in a direction parallel to the X direction of an external magnetic field and a component in a direction parallel to the Y direction of the external magnetic field by using the first and second detection units 10 and 20 of the present embodiment. A potential difference between the output terminal Vx+ and the output terminal Vx− will be represented by the symbol V1, and a potential difference between the output terminal Vy+ and the output terminal Vy− will be represented by the symbol V2. A detection value of the component in the direction parallel to the X direction of the external magnetic field has a correspondence with a value Sx given by Eq. (1) below. A detection value of the component in the direction parallel to the Y direction of the external magnetic field has a correspondence with a value Sy given by Eq. (2) below.

$$Sx = V1 - V2 \tag{1}$$

$$Sy = V1 + V2 \tag{2}$$

The detection value of the component in the direction parallel to the X direction of the external magnetic field may be one obtained by subjecting the value Sx to an amplitude or offset adjustment. The detection value of the component in the direction parallel to the Y direction of the external magnetic field may be one obtained by subjecting the value Sy to an amplitude or offset adjustment.

In the present embodiment, the first straight line L1 is parallel to the magnetosensitive direction of the first detection unit 10, and the second straight line L2 is parallel to the magnetosensitive direction of the second detection unit 20. As a result, in the present embodiment, the first detection unit 10 and the second detection unit 20 are the same or almost the same in the output characteristic, more specifically, the characteristic of a change in output with respect to a change in the angle between the direction of the external magnetic field and the magnetosensitive direction, as in the first embodiment. The present embodiment thus prevents, like the first embodiment, the first and second detection units 10 and 20 from having different output characteristics due to the soft magnetic structure 40.

The first to third detection units 10, 20, and 30 of the present embodiment may have a configuration obtained by rotating the first to third detection units 10, 20, and 30 of the second embodiment counterclockwise about the centroid C30 of the third region A30 by 45°. In such a case, the first straight line L1 is parallel to the second direction D2 and perpendicular to the magnetosensitive direction of the first detection unit 10. The second straight line L2 is parallel to the first direction D1 and perpendicular to the magnetosensitive direction of the second detection unit 20. In such a case, by a similar action to that in the second embodiment, the first and second detection units 10 and 20 are prevented from having different output characteristics due to the soft magnetic structure 40.

The remainder of configuration, function and effects of the present embodiment are similar to those of any of the first to third embodiments.

The present invention is not limited to the foregoing embodiments, and various modifications may be made thereto. For example, the configurations of the first to third detection units are not limited to the examples illustrated in the foregoing embodiments but can be freely chosen as far as the requirements of the appended claims are met.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiments.

What is claimed is:

1. A magnetic sensor comprising:
a first detection unit for detecting a first component of an external magnetic field, the first component being in a direction parallel to a first direction;
a second detection unit for detecting a second component of the external magnetic field, the second component being in a direction parallel to a second direction;
a third detection unit for detecting a third component of the external magnetic field, the third component being in a direction parallel to a third direction; and
a support for supporting the first to third detection units, wherein
the first to third directions are orthogonal to each other,
each of the first to third detection units includes at least one magnetic detection element,
the third detection unit further includes a soft magnetic structure in addition to the at least one magnetic detection element of the third detection unit, the soft magnetic structure being formed of a soft magnetic material,
the soft magnetic structure includes at least one soft magnetic layer,
when viewed in the third direction, the at least one soft magnetic layer overlaps with at least a part of a portion of the third detection unit, the portion including the at least one magnetic detection element of the third detection unit,
the support has a reference plane orthogonal to the third direction,
the reference plane includes a first region, a second region, and a third region different from each other,
the first region is a region formed by vertically projecting the first detection unit onto the reference plane,
the second region is a region formed by vertically projecting the second detection unit onto the reference plane,
the third region is a region formed by vertically projecting the third detection unit onto the reference plane, and
the first region includes a first partial region and a second partial region located on opposite sides of the third region in a direction parallel to a first straight line, and the second region includes a third partial region and a fourth partial region located on opposite sides of the third region in a direction parallel to a second straight line, the first straight line and the second straight line being two mutually orthogonal straight lines that pass through a centroid of the third region and are perpendicular to the third direction.

2. The magnetic sensor according to claim 1, wherein no portion of the first region is intersected by the second straight line, and no portion of the second region is intersected by the first straight line.

3. The magnetic sensor according to claim 1, wherein
the support includes a substrate having a top surface,
the first to third detection units are disposed on or above the top surface of the substrate, and
the reference plane is the top surface of the substrate.

4. The magnetic sensor according to claim 1, wherein all the magnetic detection elements included in the first to third detection units are located at equal distances from the reference plane.

5. The magnetic sensor according to claim 1, wherein
the soft magnetic structure further includes a magnetic-field conversion section configured to receive the third component of the external magnetic field and output an output magnetic field component, the output magnetic field component being in a direction perpendicular to the third direction,
the output magnetic field component has a strength having a correspondence with a strength of the third component of the external magnetic field, and
the third detection unit detects the strength of the output magnetic field component.

6. The magnetic sensor according to claim 1, wherein, when viewed in the third direction, the first region and the second region have such a positional relationship that the first region coincides with the second region if the first region is rotated 90° about the centroid of the third region.

7. The magnetic sensor according to claim 1, wherein each of the first and second partial regions has a symmetrical shape with respect to the first straight line, and each of the third and fourth partial regions has a symmetrical shape with respect to the second straight line.

8. The magnetic sensor according to claim 1, wherein the at least one magnetic detection element is at least one magnetoresistive element.

9. The magnetic sensor according to claim 1, wherein the first straight line is parallel to the first direction.

10. The magnetic sensor according to claim 1, wherein the first straight line is parallel to the second direction.

11. The magnetic sensor according to claim 1, wherein the first straight line forms an angle of 45° with the first direction.

12. The magnetic sensor according to claim 1, wherein a region formed by vertically projecting the at least one soft magnetic layer onto the reference plane coincides with the third region.

13. The magnetic sensor according to claim 1, wherein, when viewed in the third direction, the at least one soft magnetic layer is located to coincide with the at least one magnetic detection element of the third detection unit.

14. A magnetic sensor comprising:
a first detection unit for detecting a first component of an external magnetic field, the first component being in a direction parallel to a first direction;
a second detection unit for detecting a second component of the external magnetic field, the second component being in a direction parallel to a second direction;
a third detection unit for detecting a third component of the external magnetic field, the third component being in a direction parallel to a third direction;
a support for supporting the first to third detection units;
a plurality of magnetic detection elements; and
a plurality of terminals, wherein
the first to third directions are orthogonal to each other,
each of the first and second detection units includes at least one magnetic detection element of the plurality of magnetic detection elements,
the plurality of terminals include a power supply terminal, a ground terminal, a first output terminal, and a second output terminal that are used for the third detection unit,
the third detection unit includes a first resistor section, a second resistor section, a third resistor section, a fourth resistor section, and a soft magnetic structure formed of a soft magnetic material,
each of the first to fourth resistor sections includes at least one magnetic detection element of the plurality of magnetic detection elements, the first resistor section is provided between the power supply terminal and the first output terminal, the second resistor section is provided between the first output terminal and the ground terminal, the third resistor section is provided between the power supply terminal and the second output terminal, the fourth resistor section is provided between the second output terminal and the ground terminal, the soft magnetic structure includes a magnetic-field conversion section configured to receive the third component of the external magnetic field and output an output magnetic field component, the output magnetic field component being in a direction perpendicular to the third direction, the magnetic-field conversion section includes one or more yokes corresponding to each of the first to fourth resistor sections, the output magnetic field component has a strength having a correspondence with a strength of the third component of the external magnetic field, the third detection unit detects the strength of the output magnetic field component, the support has a reference plane orthogonal to the third direction, the reference plane includes a first region, a second region, and a third region different from each other, the first region is a region formed by vertically projecting the first detection unit onto the reference plane, the second region is a region formed by vertically projecting the second detection unit onto the reference plane, the third region is a region formed by vertically projecting the third detection unit onto the reference plane, and the first region includes a first partial region and a second partial region located on opposite sides of the third region in a direction parallel to a first straight line, and the second region includes a third partial region and a fourth partial region located on opposite sides of the third region in a direction parallel to a second straight line, the first straight line and the second straight line being two mutually orthogonal straight lines that pass through a centroid of the third region and are perpendicular to the third direction.

15. A magnetic sensor comprising:

a first detection unit for detecting a first component of an external magnetic field, the first component being in a direction parallel to a first direction;

a second detection unit for detecting a second component of the external magnetic field, the second component being in a direction parallel to a second direction;

a third detection unit for detecting a third component of the external magnetic field, the third component being in a direction parallel to a third direction; and a support for supporting the first to third detection units, wherein the first to third directions are orthogonal to each other, each of the first to third detection units includes at least one magnetic detection element, the third detection unit further includes a soft magnetic structure formed of a soft magnetic material, the soft magnetic structure includes a magnetic-field conversion section configured to receive the third component of the external magnetic field and output an output magnetic field component, the output magnetic field component being in a direction perpendicular to the third direction, the magnetic-field conversion section includes a plurality of yokes, each of the at least one magnetic detection element is applied with a magnetic field component generated by two yokes of the plurality of yokes, the magnetic field component being included in the output magnetic field component, the output magnetic field component has a strength having a correspondence with a strength of the third component of the external magnetic field, the third detection unit detects the strength of the output magnetic field component, the support has a reference plane orthogonal to the third direction, the reference plane includes a first region, a second region, and a third region different from each other, the first region is a region formed by vertically projecting the first detection unit onto the reference plane, the second region is a region formed by vertically projecting the second detection unit onto the reference plane, the third region is a region formed by vertically projecting the third detection unit onto the reference plane, and the first region includes a first partial region and a second partial region located on opposite sides of the third region in a direction parallel to a first straight line, and the second region includes a third partial region and a fourth partial region located on opposite sides of the third region in a direction parallel to a second straight line, the first straight line and the second straight line being two mutually orthogonal straight lines that pass through a centroid of the third region and are perpendicular to the third direction.

* * * * *